(12) United States Patent
Liu

(10) Patent No.: US 10,224,310 B2
(45) Date of Patent: Mar. 5, 2019

(54) HYBRID THREE-DIMENSIONAL INTEGRATED CIRCUIT RECONFIGURABLE THERMAL AWARE AND DYNAMIC POWER GATING INTERCONNECT ARCHITECTURE

(71) Applicant: QUALCOMM Incorporated, San Diego, CA (US)

(72) Inventor: Chunchen Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/336,576

(22) Filed: Oct. 27, 2016

(65) Prior Publication Data

US 2017/0125383 A1    May 4, 2017

Related U.S. Application Data

(60) Provisional application No. 62/248,136, filed on Oct. 29, 2015.

(51) Int. Cl.
*H03K 17/14* (2006.01)
*H01L 25/065* (2006.01)
(Continued)

(52) U.S. Cl.
CPC ............ *H01L 25/0657* (2013.01); *G11C 8/12* (2013.01); *H03K 17/145* (2013.01);
(Continued)

(58) Field of Classification Search
CPC ...... H03K 17/14; H03K 17/145; H01L 25/00; H01L 25/03; H01L 25/04; H01L 25/041; H01L 25/042; H01L 25/043; H01L 25/046–25/048; H01L 25/065; H01L 25/0652; H01L 25/0655; H01L 25/0657; H01L 25/07; H01L 25/071–25/075;
(Continued)

(56) References Cited

U.S. PATENT DOCUMENTS 8,624,626 B2 *  1/2014  Chi .................... H03K 19/1737
                                                                257/777
8,701,073 B1     4/2014  Fu et al.
(Continued)

OTHER PUBLICATIONS

International Search Report and Written Opinion—PCT/US2016/059486—ISA/EPO—dated Dec. 21, 2016.

*Primary Examiner* — Lincoln D Donovan
*Assistant Examiner* — Diana J Cheng
(74) *Attorney, Agent, or Firm* — Loza & Loza LLP

(57) ABSTRACT

Systems, methods, and apparatus for operating an integrated circuit (IC) are provided. An apparatus may be configured to receive at one or more switches a signal from at least one circuit positioned on a first die lying within a first geometric plane, detect a signaling path between the at least one circuit positioned on the first die and at least one circuit positioned on a second die lying within a second geometric plane that is different from the first geometric plane, and control the one or more switches to route the signal along the signaling path. Circuits having a similar power characteristic are positioned adjacent to each other on the first die or the second die and circuits having a high temperature characteristic are positioned separate from each other on the first die or the second die.

27 Claims, 31 Drawing Sheets

(51) Int. Cl.
  *B23K 11/24*  (2006.01)
  *H02B 1/24*  (2006.01)
  *G11C 8/12*  (2006.01)

(52) U.S. Cl.
  CPC .............. *H01L 2224/16145* (2013.01); *H01L 2224/16227* (2013.01); *H01L 2225/06517* (2013.01); *H01L 2225/06541* (2013.01); *H01L 2225/06589* (2013.01)

(58) Field of Classification Search
  CPC ............. H01L 25/0753; H01L 25/0756; H01L 2225/00; H01L 2225/03; H01L 2225/04; H01L 2225/065; H01L 2225/06503; H01L 2225/06506; H01L 2225/0651; H01L 2225/06517; H01L 2225/06541; H01L 2225/06544; H01L 2225/06589
  See application file for complete search history.

(56) References Cited

U.S. PATENT DOCUMENTS

| | | |
|---|---|---|
| 8,856,705 B2 | 10/2014 | Shroff et al. |
| 9,003,344 B2 | 4/2015 | Kennedy et al. |
| 2009/0321910 A1 | 12/2009 | Choi |
| 2011/0033007 A1 | 2/2011 | Zerbe et al. |
| 2013/0021866 A1 | 1/2013 | Lee |
| 2013/0277855 A1 | 10/2013 | Kang et al. |
| 2015/0318267 A1* | 11/2015 | Yu ........................ H01L 23/481 |
| | | 257/774 |

* cited by examiner

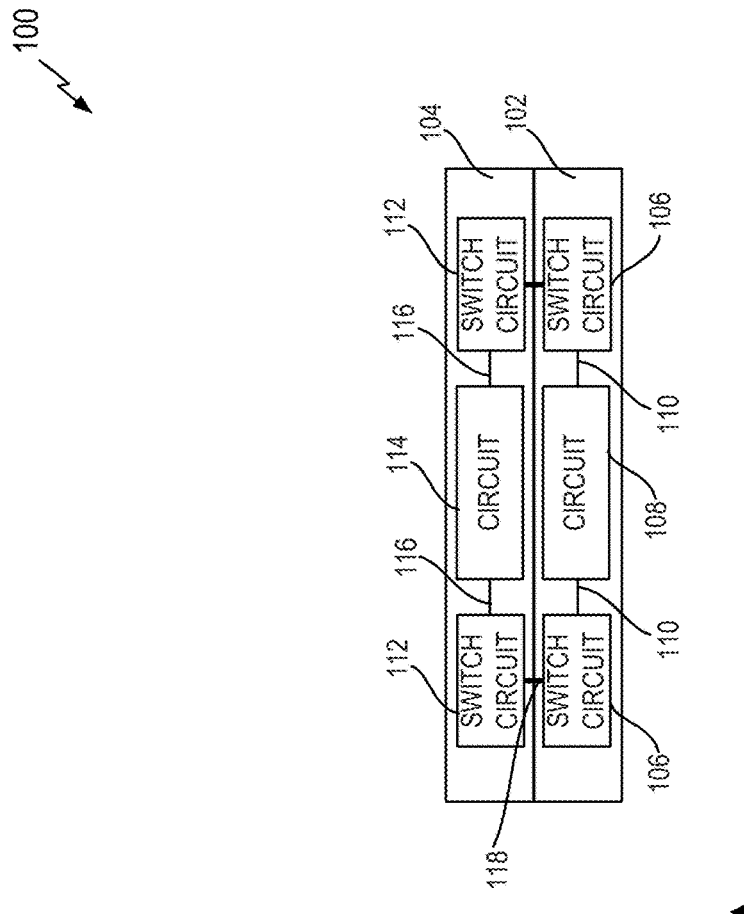
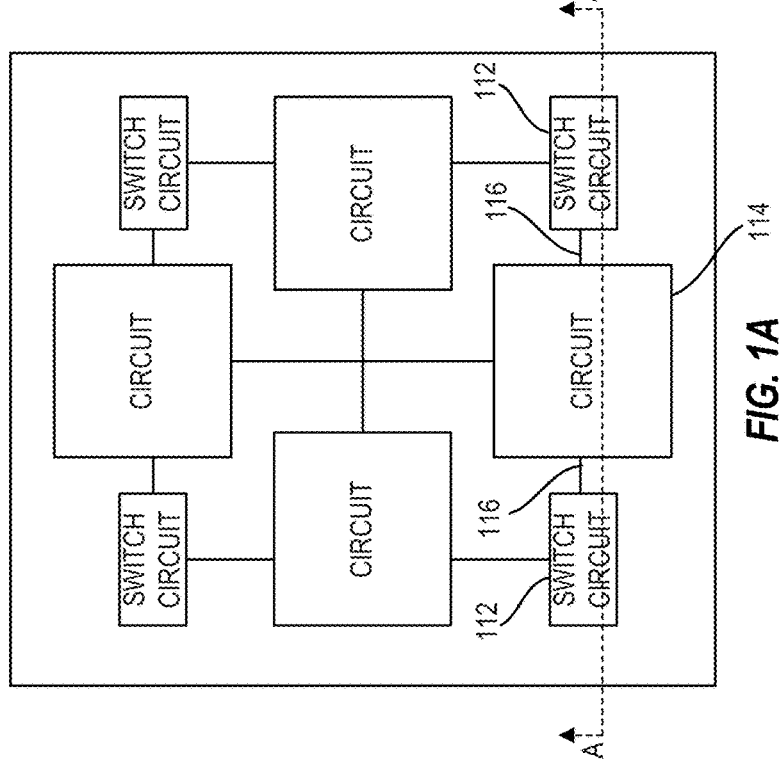
FIG. 1

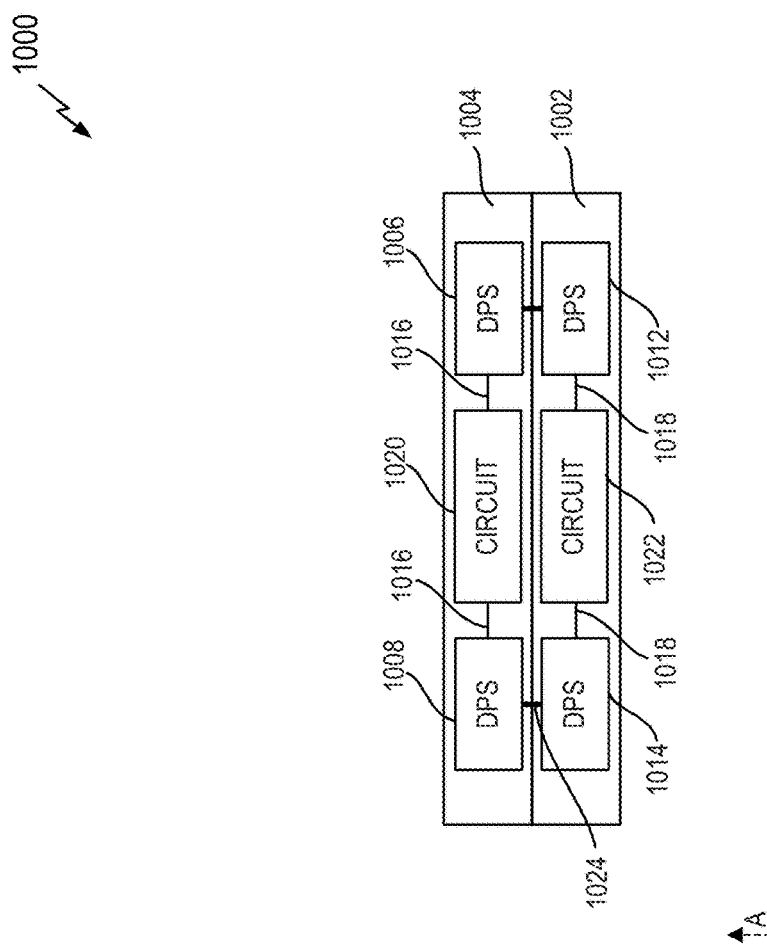
*FIG. 10B*
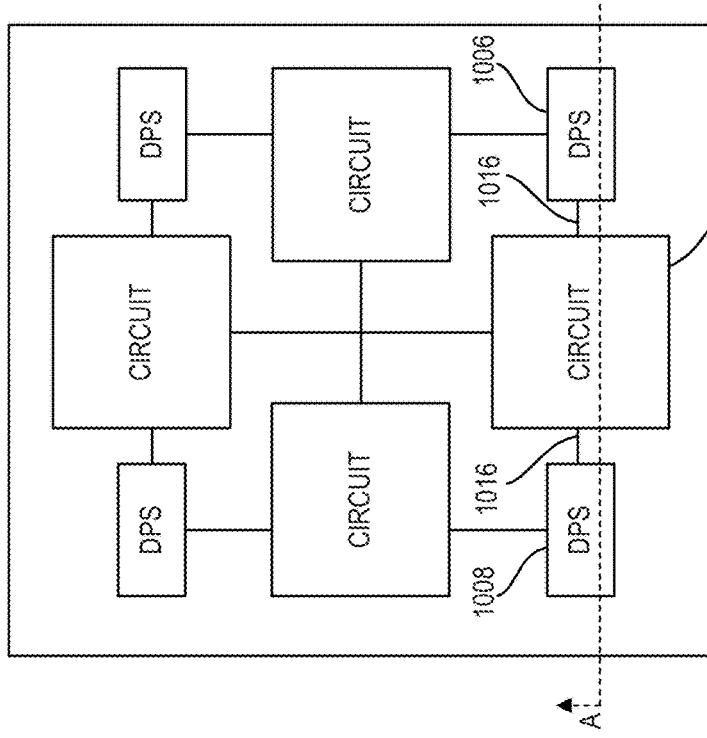
*FIG. 10A*
*FIG. 10*

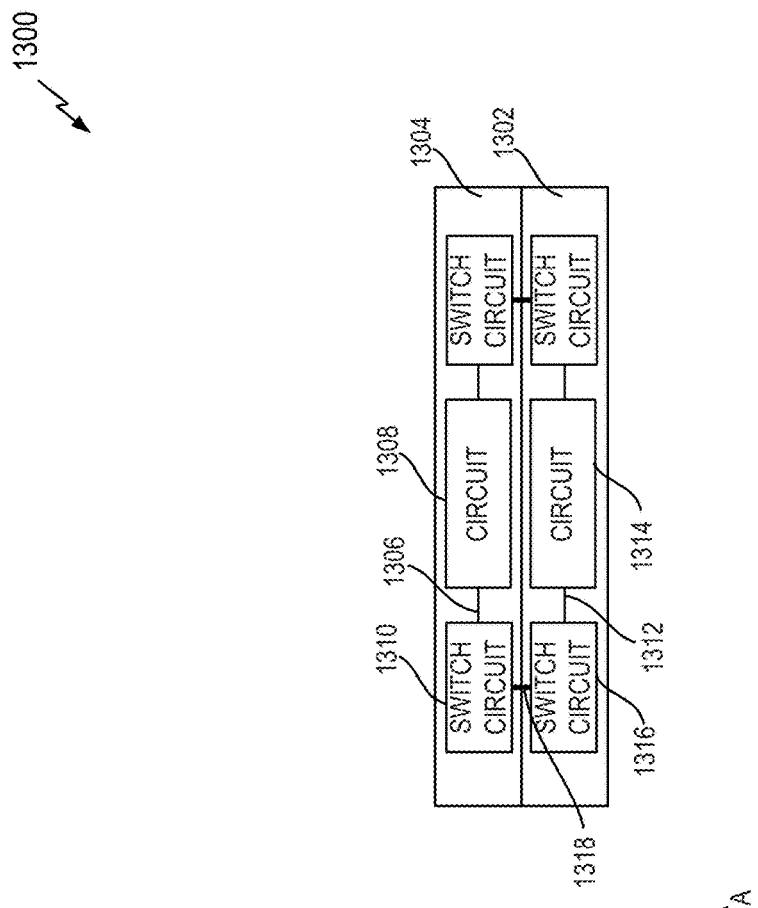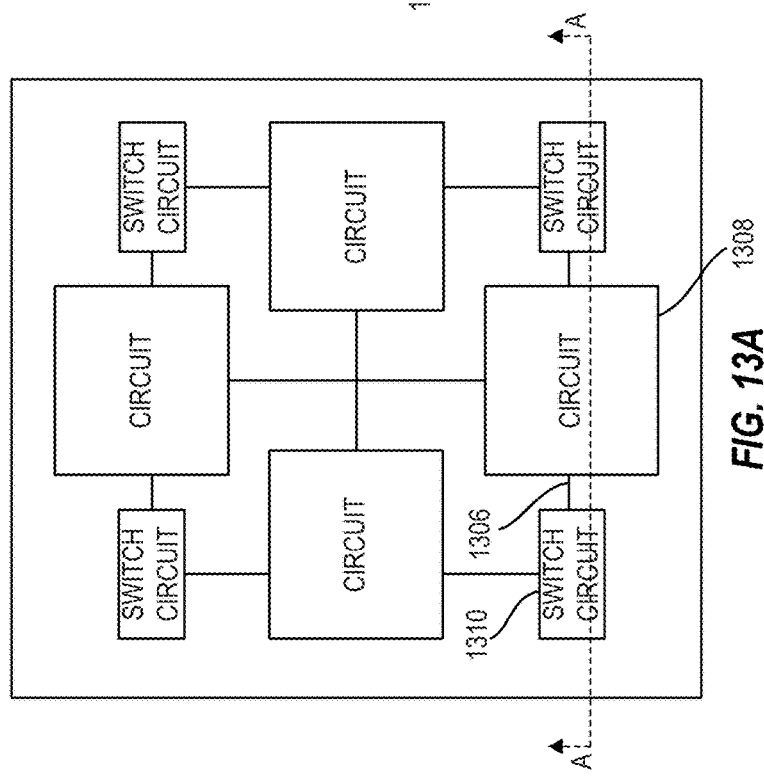
FIG. 13A
FIG. 13B
FIG. 13

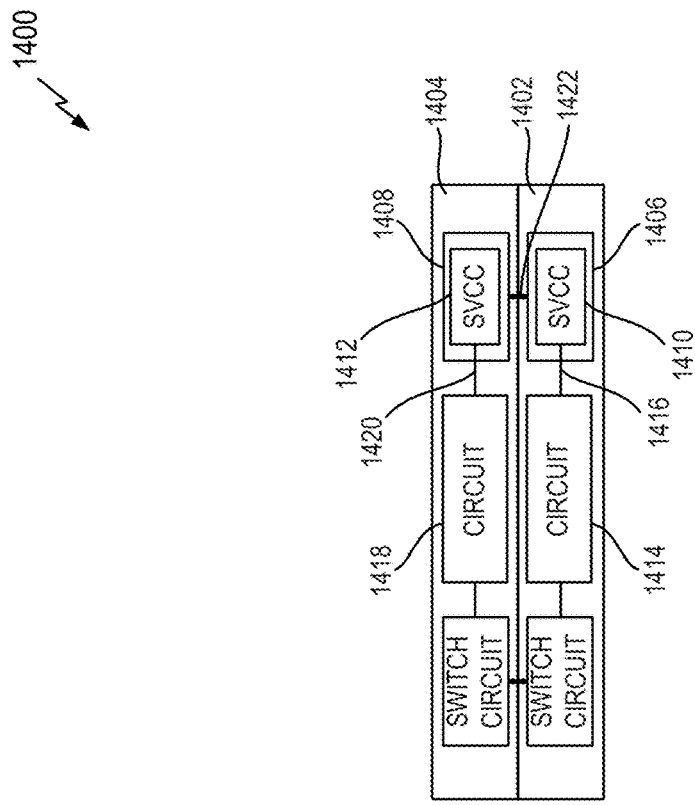
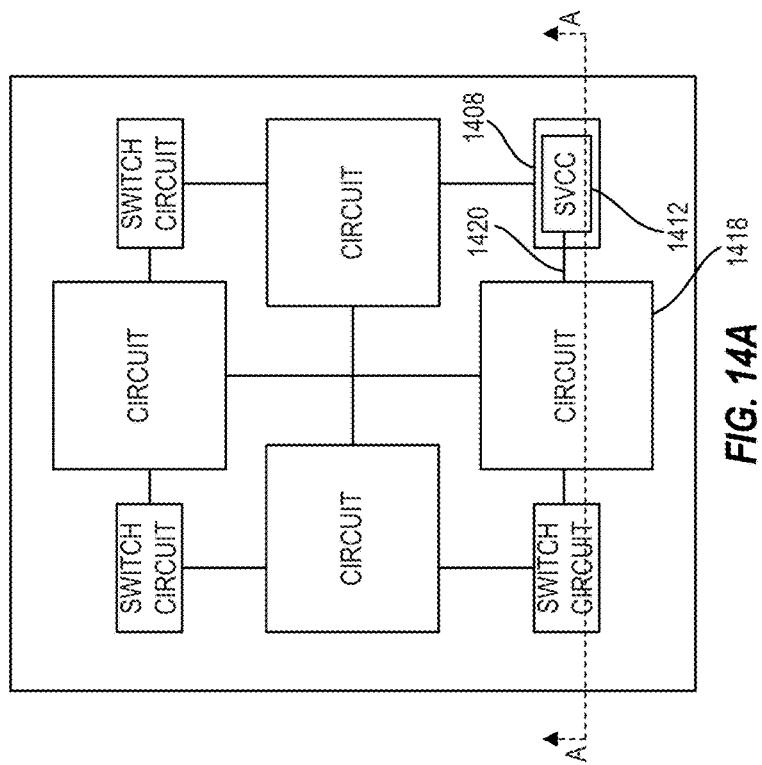
FIG. 14A
FIG. 14B
FIG. 14

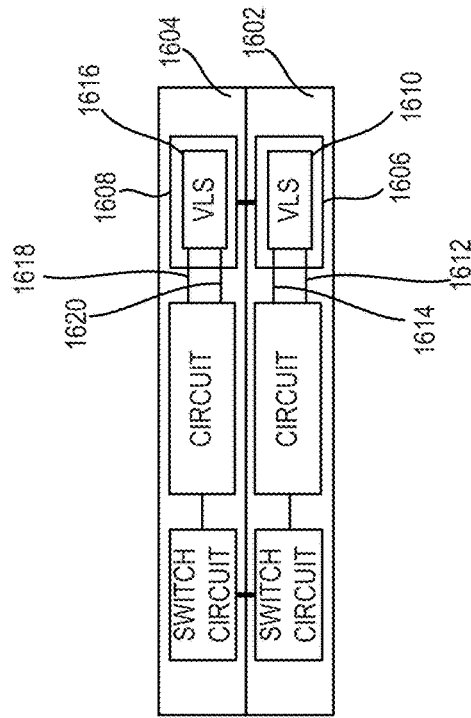
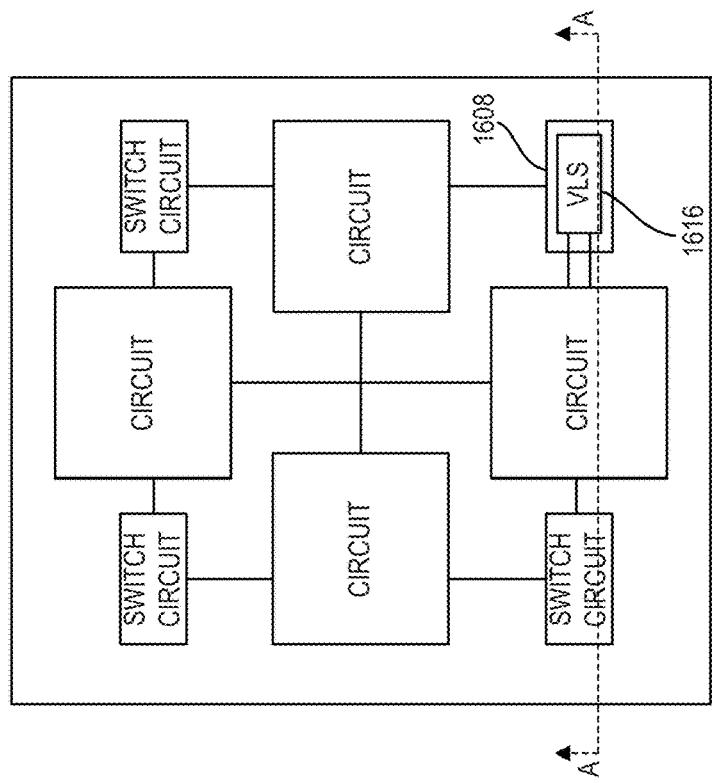
FIG. 16

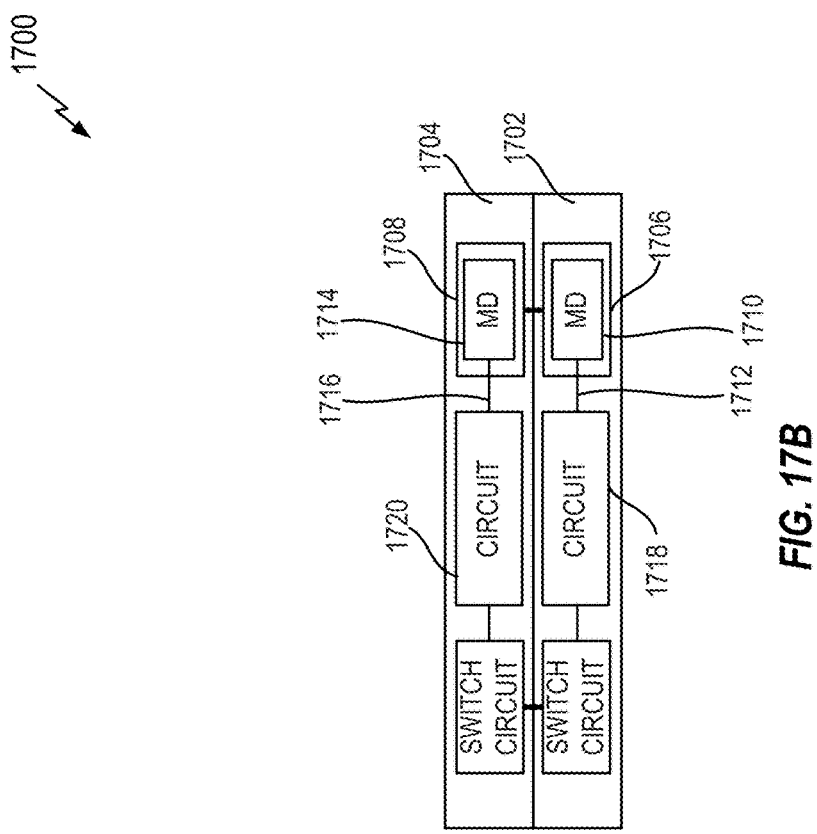
FIG. 17A
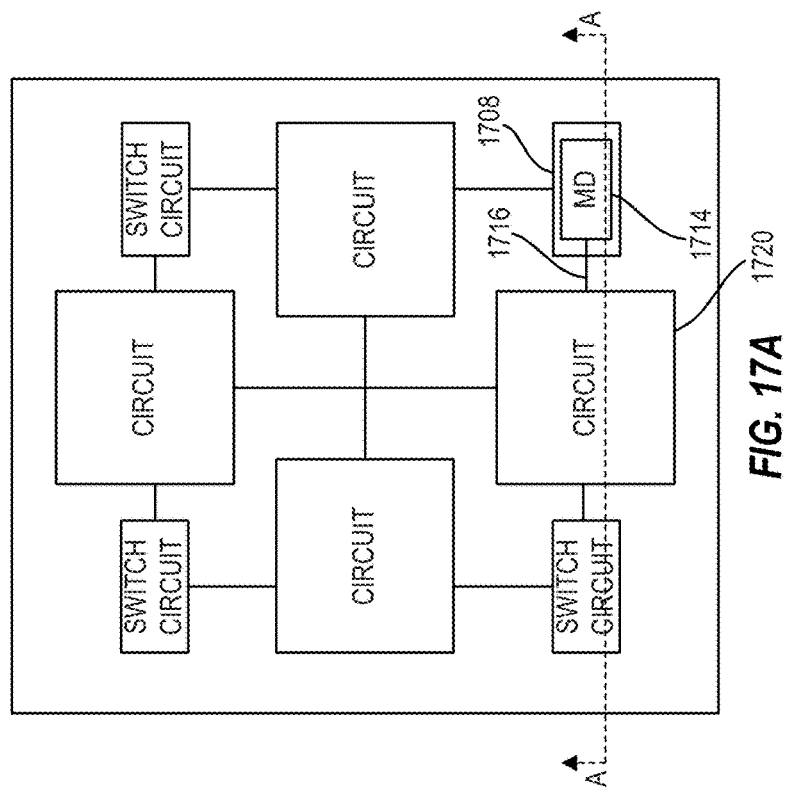
FIG. 17B
FIG. 17

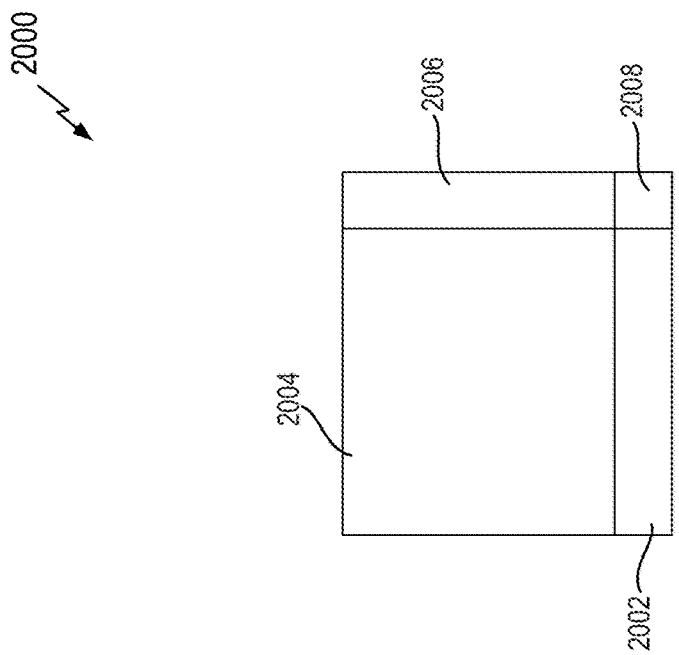
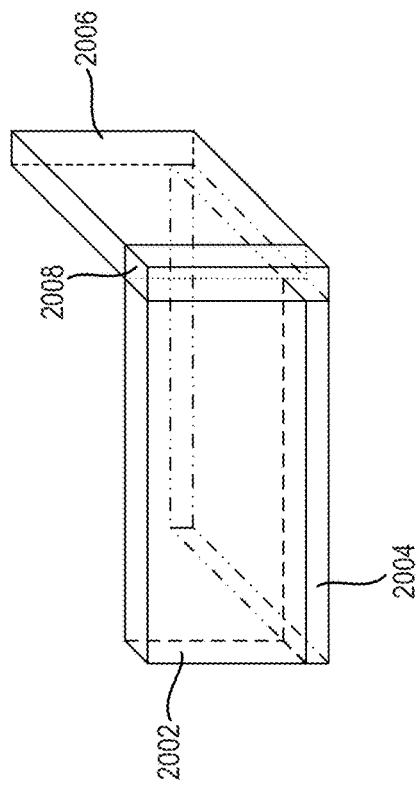
FIG. 20

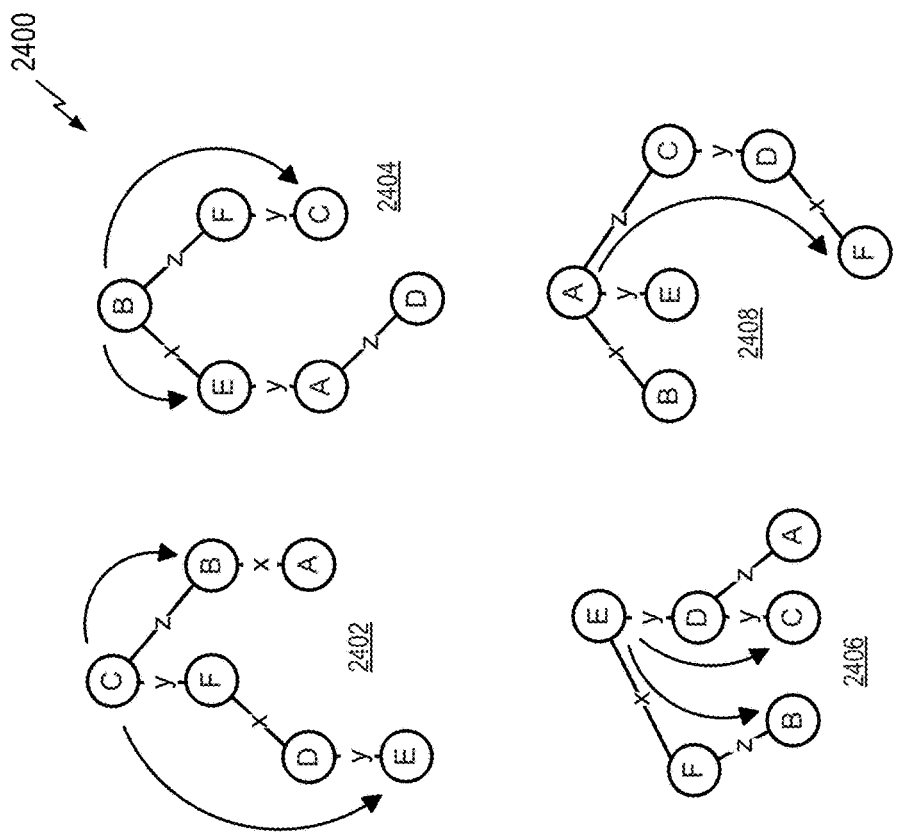
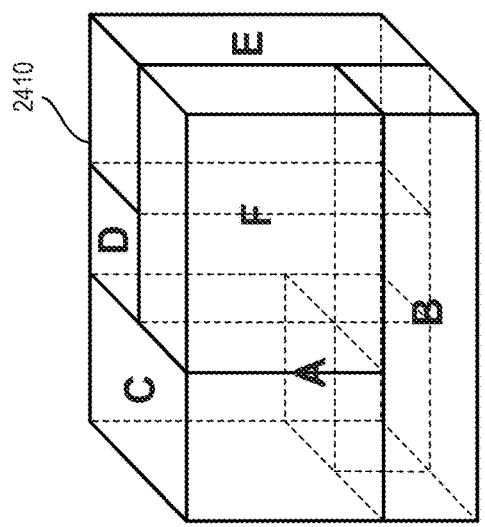
FIG. 24

HYBRID THREE-DIMENSIONAL INTEGRATED CIRCUIT RECONFIGURABLE THERMAL AWARE AND DYNAMIC POWER GATING INTERCONNECT ARCHITECTURE

CROSS-REFERENCE TO RELATED APPLICATIONS

This application claims priority to and the benefit of U.S. Provisional Application Ser. No. 62/248,136, entitled "HYBRID 3D IC RECONFIGURABLE THERMAL AWARE AND DYNAMIC POWER GATING INTERCONNECT STRUCTURE" and filed on Oct. 29, 2015, the entire content of which is incorporated herein by reference.

BACKGROUND

Field

Aspects of the disclosure relate generally to electronic circuits, and more specifically, but not exclusively, to a reconfigurable three-dimensional (3D) integrated circuit (IC).

Background

Conventional three-dimensional integrated circuit (3D-IC) architectures include a so-called 2.5D architecture and a fully stacked three-dimensional (3D) architecture. In a 2.5D architecture, dies are placed side-by-side and interconnected via a horizontal interposer layer. A fully stacked 3D architecture employs dies that are stacked on top of one another. Both architectures use through-silicon vias (TSVs) to connect the metal layers.

Existing 3D-IC routing design faces several critical challenges relating to power distribution network (PDN) design and thermal management. A typical 3D-IC PDN is implemented as a pyramid shape where power rails are used to supply the power from the bottom of the IC to the top of the IC. This PDN occupies significant die area and leads to routing congestion. Regarding thermal management, when multiple dies are stacked together, it is difficult to dissipate the heat, especially for bottom dies. This can lead to a dramatic degradation in overall system performance at high temperatures. Accordingly, there is a need for a new architecture that resolves PDN design and thermal management issues associated with 3D-IC.

SUMMARY

Certain aspects of the disclosure relate to systems, apparatus, methods, and techniques for operating an integrated circuit (IC).

In various aspects of the disclosure, a method of operating an integrated circuit (IC) includes receiving a signal from at least one circuit positioned on a first die lying within a first geometric plane, detecting a signaling path between the at least one circuit positioned on the first die and at least one circuit positioned on a second die lying within a second geometric plane that is different from the first geometric plane, wherein circuits having a similar power characteristic are positioned adjacent to each other on the first die and the second die and circuits having a high temperature characteristic are positioned separate from each other on the first die and the second die, and controlling one or more switches to route the signal along the signaling path.

According to some aspects, each circuit having the high temperature characteristic is positioned adjacent to a circuit having a low temperature characteristic. The at least one circuit positioned on the first die is electrically coupled to the at least one circuit positioned on the second die via the one or more switches. Also, the circuits having the similar power characteristic may share a single switch. The apparatus may control the one or more switches by dynamically switching the one or more switches to reconfigure the signaling path between the at least one circuit positioned on the first die and the at least one circuit positioned on the second die.

In some aspects, at least one of the first die or the second die includes a plurality of layers including an upper layer, a bottom layer, and at least one middle layer. As such, the upper layer is electrically connected to the bottom layer by at least one first through-silicon via (TSV). Moreover, the at least one middle layer is electrically connected to the upper layer or the bottom layer by at least one second TSV, wherein the at least one second TSV is smaller than the at least one first TSV.

In various aspects of the disclosure, an apparatus for operating an integrated circuit (IC) may be adapted to receive a signal from at least one circuit positioned on a first die lying within a first geometric plane, detect a signaling path between the at least one circuit positioned on the first die and at least one circuit positioned on a second die lying within a second geometric plane that is different from the first geometric plane, wherein circuits having a similar power characteristic are positioned adjacent to each other on the first die and the second die and circuits having a high temperature characteristic are positioned separate from each other on the first die and the second die, and control one or more switches to route the signal along the signaling path.

In various aspects of the disclosure, an apparatus for operating an integrated circuit (IC) may have means for receiving a signal from at least one circuit positioned on a first die lying within a first geometric plane, means for detecting a signaling path between the at least one circuit positioned on the first die and at least one circuit positioned on a second die lying within a second geometric plane that is different from the first geometric plane, wherein circuits having a similar power characteristic are positioned adjacent to each other on the first die and the second die and circuits having a high temperature characteristic are positioned separate from each other on the first die and the second die, and means for controlling one or more switches to route the signal along the signaling path.

In various aspects of the disclosure, a processor readable storage medium is disclosed. The storage medium may be a non-transitory storage medium and may store instructions that, when executed by one or more processors, causes the one or more processors to receive a signal from at least one circuit positioned on a first die lying within a first geometric plane, detect a signaling path between the at least one circuit positioned on the first die and at least one circuit positioned on a second die lying within a second geometric plane that is different from the first geometric plane, wherein circuits having a similar power characteristic are positioned adjacent to each other on the first die and the second die and circuits having a high temperature characteristic are positioned separate from each other on the first die and the second die, and control one or more switches to route the signal along the signaling path.

In various aspects of the disclosure, an integrated circuit may include a first die lying within a first geometric plane, a second die lying within a second geometric plane that is different from the first geometric plane, a plurality of circuits positioned among the first die and the second die, wherein circuits having a similar power characteristic are positioned adjacent to each other on the first die and the second die and circuits having a high temperature characteristic are positioned separate from each other on the first die and the second die, and one or more switches configured to route the circuits positioned on the first die to the circuits positioned on the second die.

In various aspects of the disclosure, a method of operating an integrated circuit (IC) may include controlling one or more switches to route a signal along a signaling path between a first die lying within a first geometric plane and a second die lying within a second geometric plane different from the first geometric plane, wherein the signal is coupled to a plurality of circuits on the first die, wherein the plurality of circuits comprises circuits having a similar power characteristic positioned adjacent to each other, and wherein the signal is further coupled to a second plurality of circuits on the first die or the second die, wherein the second plurality of circuits comprises circuits having a high temperature characteristic positioned separate from each other, and routing the signal along the signaling path.

In various aspects of the disclosure, an apparatus for operating an integrated circuit (IC) may have means for controlling one or more switches to route a signal along a signaling path between a first die lying within a first geometric plane and a second die lying within a second geometric plane different from the first geometric plane, wherein the signal is coupled to a plurality of circuits on the first die, wherein the plurality of circuits comprises circuits having a similar power characteristic positioned adjacent to each other, and wherein the signal is further coupled to a second plurality of circuits on the first die or the second die, wherein the second plurality of circuits comprises circuits having a high temperature characteristic positioned separate from each other, and means for routing the signal along the signaling path.

In various aspects of the disclosure, an integrated circuit (IC) may include a first die lying within a first geometric plane, a second die lying within a second geometric plane that is different from the first geometric plane, a plurality of circuits on the first die, wherein the plurality of circuits comprises circuits having a similar power characteristic positioned adjacent to each other, one or more switches configured to route a signal coupled to the plurality of circuits along a signaling path between the first die and the second die, a second plurality of circuits on the first die or the second die, wherein the signal is further coupled to the second plurality of circuits, and wherein the second plurality of circuits comprises circuits having a high temperature characteristic positioned separate from each other.

BRIEF DESCRIPTION OF THE DRAWINGS

FIG. 1, including the plan view of FIG. 1A and the side sectional view of FIG. 1B, is an example of a 3D-IC in accordance with some aspects of the disclosure.

FIG. 10, including the plan view of FIG. 10A and the side sectional view of FIG. 10B, is a schematic representation of an example of dynamically programmable switches in a 3D-IC in accordance with some aspects of the disclosure.

FIG. 13, including the plan view of FIG. 13A and the side sectional view of FIG. 13B, is a schematic representation of an example of power distribution in a 3D-IC in accordance with some aspects of the disclosure.

FIG. 14, including the plan view of FIG. 14A and the side sectional view of FIG. 14B, is a schematic representation of an example of power control circuits in a 3D-IC in accordance with some aspects of the disclosure.

FIG. 16, including the plan view of FIG. 16A and the side sectional view of FIG. 16B, is a schematic representation of an example of signal level shifter circuits in a 3D-IC in accordance with some aspects of the disclosure.

FIG. 17, including the plan view of FIG. 17A and the side sectional view of FIG. 17B, is a schematic representation of an example of memory circuits in a 3D-IC in accordance with some aspects of the disclosure.

FIG. 20, including the perspective view of FIG. 20A and the plan view of FIG. 20B, is an example of dies in different geometric planes in accordance with some aspects of the disclosure.

FIG. 24 is a diagram illustrating four ternary trees representing a unique and valid 3D floorplan.

DETAILED DESCRIPTION

Figure 2:
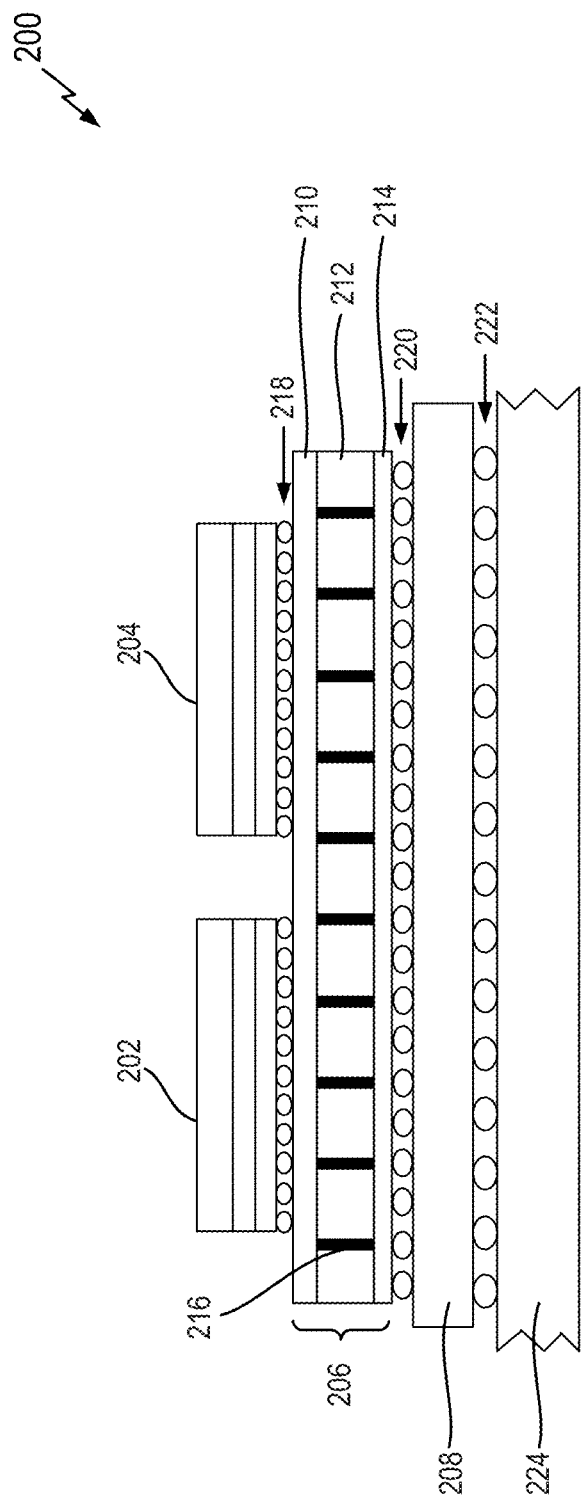
FIG. 2 is a side sectional view of an example of a 2.5D IC.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

According to aspects of the present disclosure, a novel 3D-IC architecture is provided that combines a reconfigurable 2D structure with a monolithic 3D structure. The novel 3D-IC architecture resolves power distribution network (PDN) design and thermal management issues associated with traditional 3D-IC architectures, and further provides additional power control and programmable routing capability. In an aspect, the novel 3D-IC architecture provides a cost effective way to integrate different modules together using a stacked interposer structure. In a further aspect, the novel 3D-IC architecture is adjustable through the use of power rails and signal paths that can be routed dynamically using reconfigurable peripheral switches. Moreover, the novel 3D-IC architecture saves device area by using a monolithic 3D structure to realize the modules. According to further aspects of the present disclosure, a novel thermal aware hierarchical simulated annealing (SA) floorplan algorithm designed for the novel 3D-IC architecture is provided. Hence, the thermal management issues associated with traditional 3D-IC architectures are further resolved by use of the novel floorplan algorithm.

FIG. 1 is an example of a 3D-IC 100 in accordance with some aspects of the disclosure. FIG. 1 includes a plan view as shown in FIG. 1A, and a side sectional view as shown in FIG. 1B taken from the view A-A of FIG. 1A.

The 3D-IC 100 includes a first die 102 lying within a first geometric plane and a second die 104 lying within a second geometric plane. In this example, the first and second dies 102 and 104 are parallel to one another and in a stacked arrangement. Specifically, the second die 104 is stacked on top of the first die 102. Other die configurations may be employed in other implementations. For example, a 3D-IC implemented in accordance with the teachings herein may include more than two dies. In addition, in some implementations the dies are not stacked on top of the other. Also, in some implementations, the dies are not parallel (i.e., the dies lie in geometric planes that are not parallel with respect to one another).

Each of the dies includes electrically coupled switch circuits and other circuits (e.g., logic circuits, digital circuits, analog circuits, and so on). The first die 102 includes switch circuits 106 and circuits 108, where at least one of the switch circuits 106 is electrically coupled to at least one of the circuits 108 via at least one electrical path 110 (e.g., a signal bus). Similarly, the second die 104 includes switch circuits 112 and circuits 114, where at least one of the switch circuits 112 is electrically coupled to at least one of the circuits 114 via at least one electrical path 116 (e.g., a signal bus). Also, interconnections (e.g., an electrical path 118) are provided between the switch circuits 106 and 112.

In some implementations, each switch circuit supports one or more of: programmable signal routing, distribution of a voltage supply, distribution of multiple voltage supplies, or voltage level shifting. For convenience, such a switch circuit may be referred to herein as a peripheral switch (e.g., indicating that the switch may be separate from other circuit components of an IC).

A voltage control circuit (e.g., including a voltage regulator) can be integrated into a switch circuit to provide one or more voltages for an individual die. Thus, in some aspects, switch circuits on different dies may each be coupled to a power distribution path on the respective die. Moreover, in some aspects, switch circuits on different dies may each include a supply voltage control circuit. In implementations that employ multiple supply voltage levels, each of the supply voltage control circuits may generate a plurality of supply voltage levels. A level shifter can be included in a switch circuit to shift signal levels between different power supply domains. Thus, in some aspects, switch circuits on different dies may each be coupled to a power distribution path on the respective die.

For IC testing, a switch circuit can reroute test signals from one die to another. Thus, in some aspects, switch circuits on different dies may each be coupled to a test signal path on the respective die. By dynamically configuring the routing of test signals in this manner, design feasibility can be improved. Moreover, this dynamic switching functionality can be used to bypass a failed die by rerouting signals. The switch is thus valuable during the IC (chip) "bring-up" stage since it can be used to isolate the verification target and isolate the root cause of a failure.

Switch circuits as discussed herein may provide digital and/or analog connectivity. Digital switch circuitry may connect, for example and without limitation, one or more of: digital logic circuits, digital memory circuits, or digital power distribution circuits. Analog switch circuitry may connect, for example and without limitation, one or more of: analog logic circuits, analog power distribution circuits, analog radio frequency (RF) circuits (e.g., RF transmitter and/or RF receiver circuits), analog phase locked loop (PLL) circuits, or analog circuitry of digital-to-analog converter (DAC) circuits and/or analog-to-digital converter (DAC) circuits.

In view of the above, multiple dies with different functionality can be integrated into a single IC package. Advantageously, this can be achieved while mitigating conventional routing congestion and heat dissipation problems seen in conventional 3D architectures. As mentioned above, a conventional 3D-IC is implemented using either a 2.5D interposer architecture or fully stacked 3D architecture.

In a 2.5D interposer architecture, multiple dies are placed on top of an interposer and connected together through TSVs and a flip chip configuration. This approach reuses current system-on-chip (SoC) design methodology to shorten the design cycle as well as reduce the design cost. The interposer is manufactured with mature main stream technology to further offset the cost.

The concept of 2.5D ICs is based on a system-in-package (SiP) approach where different dies are placed on a common substrate. The interconnect between the dies is built on the common substrate. Compared with SoC devices, SiP devices have the advantages of lower cost and higher flexibility because each die is implemented using that domain's most appropriate technology process.

FIG. 2 is a side sectional view of an example of a conventional 2.5D IC 200. In 2.5D IC, the modules are mounted on an interposer and connected using through-silicon via (TSV) and a redistribution layer (RDL). The 2.5D IC 200 includes a first die 202 and a second die 204. As shown, a silicon interposer 206 is placed between a SiP substrate 208 and dies 202 and 204. In an example, the die 202 may include a logic circuit and the die 204 may include a memory device. The silicon interposer 206 includes topside metal layers 210, an interposer substrate 212, and backside metal layers 214. The silicon interposer 206 also includes through-silicon vias (TSVs) 216 connecting the metallization layers 210 and 214 on the upper and lower surfaces. Micro-bumps 218 attach the dies 202 and 204 and the interposer 206. The interposer 206 is attached to the SiP substrate 208 via flip-chip bumps 220. Package bumps 222 attach the SiP substrate 208 to a circuit board 224.

The tracks on the topside and backside metal layers of the interposer 206 are created using the same process as the track on the silicon chip, which resolves a major problem of two-dimensional (2D) ICs due to the size difference of tracks on substrate and those on dies. This discrepancy in 2D architectures results in performance loss and increased power consumption.

In a fully stacked 3D architecture, multiple dies are stacked together and connected through on-die TSVs. This can improve the overall system performance as well as reduce the cost. For example, fully stacked 3D-ICs are seen as a desirable alternative to overcome interconnect scaling issues that can be a major bottleneck on 2D ICs. Fully stacked 3D-ICs, with the advantage of a smaller footprint area, reduce the wire length on each layer. Also, TSV technology is implemented for vertical interconnect between dies, which reduces the long cross-chip interconnects that may exist in 2D ICs.

Figure 3:
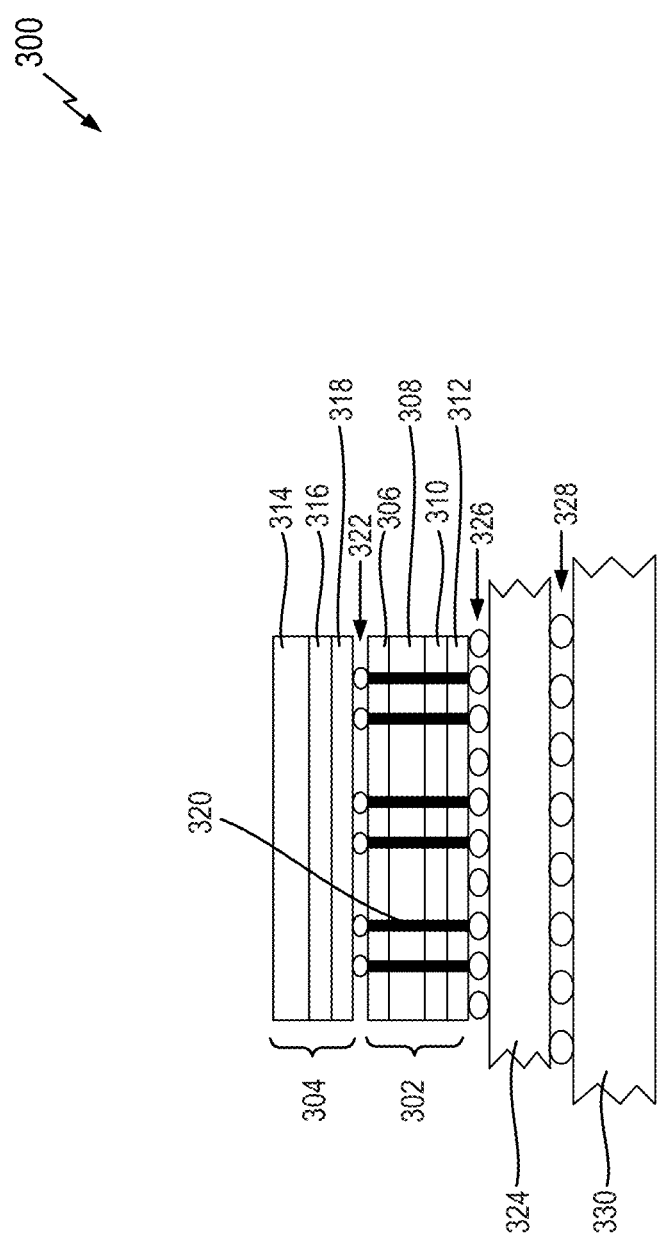
FIG. 3 is a side sectional view of an example of a fully stacked 3D-IC.

FIG. 3 is a side sectional view of an example of a conventional fully stacked 3D-IC 300. The 3D-IC 300 includes a first die 302 and a second die 304.

The first die 302 includes backside metal layers 306, a chip substrate 308, a device layer 310, and standard metal layers 312. The second die 304 includes a chip substrate 314, a device layer 316, and standard metal layers 318. In an example, the first die 302 may include a logic circuit and the second die 304 may include a memory device. The first die 302 includes TSVs 320 for connecting the metallization layers 306 and 312 on the upper and lower surfaces. Micro-bumps 322 attach the dies 302 and 304. The first die 302 is attached to a SiP substrate 324 via flip-chip bumps 326. Package bumps 328 attach the SiP substrate 324 to a circuit board 330.

Instead of using an interposer for routing and power distribution as in 2.5D ICs, the 3D-IC stacks dies directly and implements the routing in the intermediate dies. Since the thickness of an individual die is very small, ideally one could mount as many dies as needed. In practice, however, there are several challenges involved in manufacturing 3D-ICs, which restricts the application of 3D-ICs.

One challenge relates to the PDN design. The typical 3D-IC PDN is implemented as a pyramid shape where additional power rails supply power from the bottom die to the top die.

Figure 4:
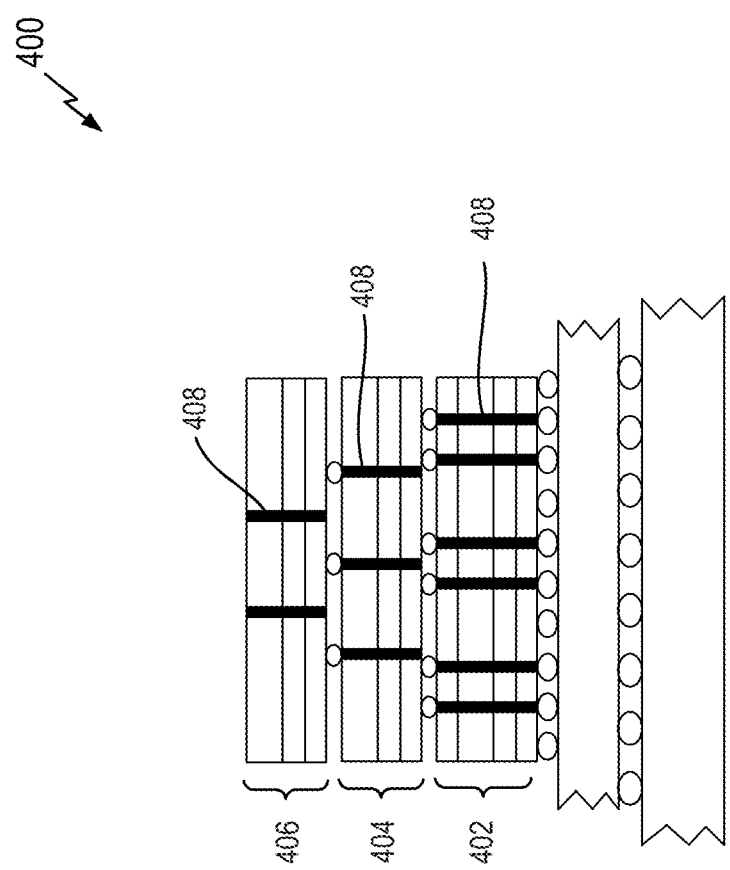
FIG. 4 is a side sectional view of a power distribution network in a fully stacked 3D-IC.

FIG. 4 is a side sectional view of such a power distribution network in a conventional 3D-IC 400. The 3D-IC 400 includes a first die 402, a second die 404, and a third die 406. Each of the dies includes TSVs 408 for connecting, for example, respective metallization layers on upper and lower surfaces.

Here, it may be seen that the PDN TSVs 408 occupy significant die area and can create a routing congestion problem, particularly, on the lower dies. Moreover, in modern IC design, the current*resistance (IR) drop may be significant even if TSVs are used because the margin working voltage is smaller.

Besides the IR drop and space usage, PDNs have conventionally supplied only a restricted voltage scale because the PDNs use a single power supply from the circuit board. Therefore, the voltage only scales down as the supply passes from one layer to the next (e.g., due to IR drop). Moreover, a higher voltage in the lower layer leads to more severe thermal issues in that layer.

Another challenge in 3D-IC design relates to thermal management. When multiple dies are stacked together, it is difficult to dissipate the heat, especially for bottom dies. The overall system performance is dramatically degraded at high temperature. The use of micro-channels and liquid cooling has been proposed for 3D-IC designs; however, this technology has major drawbacks due to additional hardware requirements and operation difficulty. The use of additional TSVs can improve the heat dissipation, however, this may negatively impact the usable area on the die and the amount of stress the die can withstand.

Figure 5:
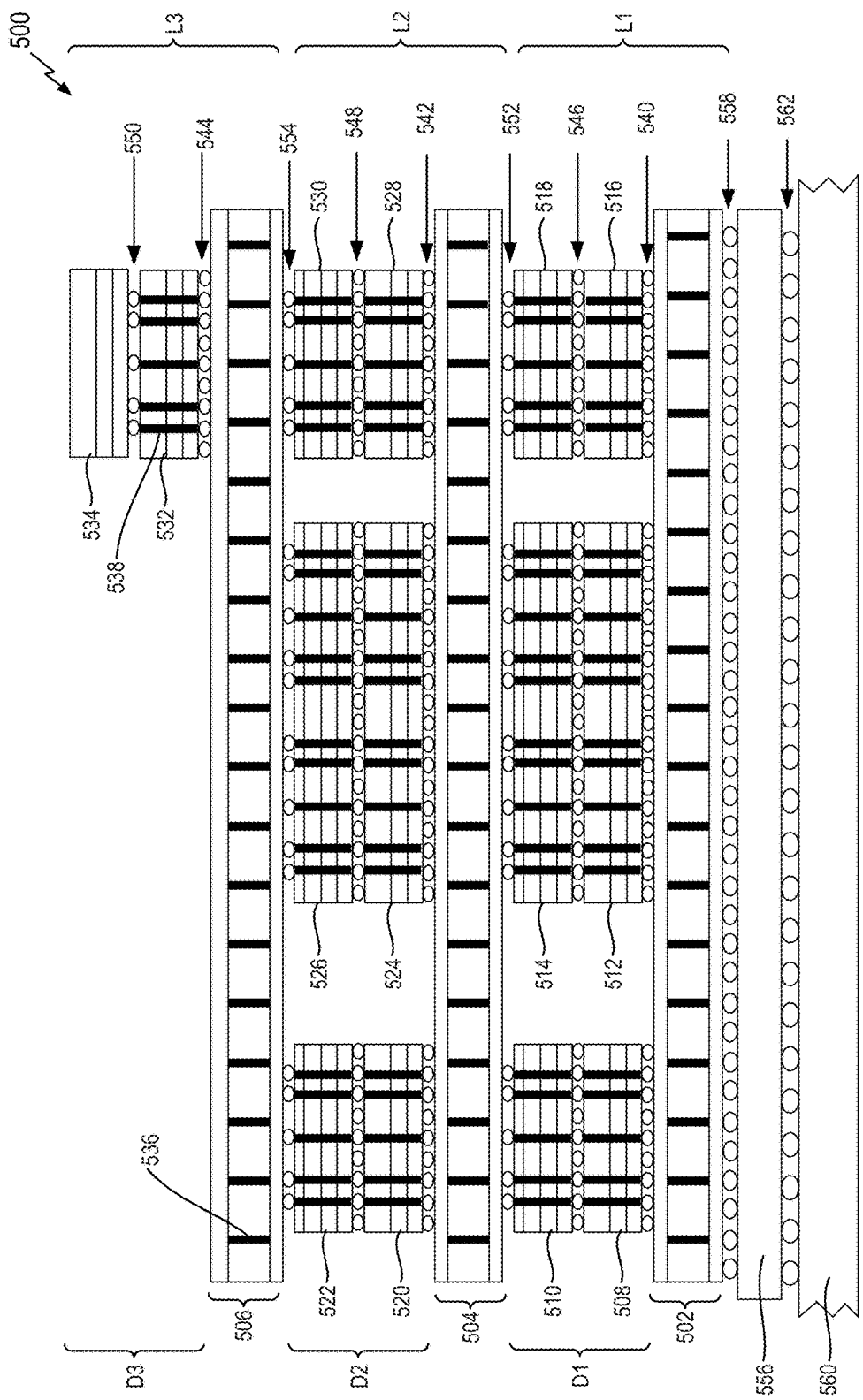
FIG. 5 is a side sectional view of an example of a 3D-IC in accordance with some aspects of the disclosure.

Referring now to FIG. 5, the disclosure relates in some aspects to a 3D-IC hybrid architecture that includes programmable switch routing along with configuration advantages of the 2.5D and fully stacked 3D architectures. In some aspects, the architecture of FIG. 5 not only resolves PDN design and thermal management issues, but also provides additional power control and programmable routing capability for 3D-IC design.

In the side sectional view FIG. 5, a 3D-IC 500 includes a first layer L1, a second layer L2, and a third layer L3 in respective geometric planes (horizontal planes in the perspective of FIG. 5). Each of the first, second, and third layers L1, L2, and L3 includes a respective first, second, or third interposer layer 502, 504, or 506, and a respective first, second or third die layer D1, D2, or D3.

The first layer L1 lies within a first geometric plane. The first interposer layer 502 includes wire traces for electrically coupling the dies 508-518 of the first die layer D1. At least two of the stacked dies (e.g., a first pair of stacked dies 508 and 510 and/or a second pair of stacked dies 516 and 518) include at least one peripheral switch for wire routing in another dimension (a vertical dimension in the perspective of FIG. 5) to connect the first layer L1 to the other layers. At least one of the dies 508-518 (e.g., a third pair of stacked dies 512 and 514) includes at least one other circuit (e.g., at least one logic circuit, at least one digital circuit, at least one analog circuit, etc.).

The second layer L2 lies within a second geometric plane. The second interposer layer 504 includes wire traces for electrically coupling the dies 520-530 of the second die layer D2. At least two of the stacked dies (e.g., a first pair of stacked dies 520 and 522 and/or a second pair of stacked dies 528 and 530) include at least one peripheral switch for wire routing in another dimension (a vertical dimension in the perspective of FIG. 5) to connect the second layer L2 to the other layers. At least one of the dies 520-530 (e.g., a third pair of stacked dies 524 and 526) includes at least one other circuit (e.g., at least one logic circuit, at least one digital circuit, at least one analog circuit, etc.).

The third layer L3 lies within a third geometric plane. The third interposer layer 506 includes wire traces for electrically coupling the dies 532 and 534 of the third die layer D3. A portion of the stacked dies 532 and 534 includes at least one peripheral switch for wire routing in another dimension (a vertical dimension in the perspective of FIG. 5) to connect the third layer L3 to the other layers. Another portion of the stacked dies 532 and 534 includes at least one other circuit (e.g., at least one logic circuit, at least one digital circuit, at least one analog circuit, etc.).

Each of the first, second and third layers L1, L2, and L3 includes TSVs as represented by the thick vertical lines. For example, a TSV 536 is specifically referenced in the third interposer layer 506 and a TSV 538 is specifically referenced in the third die layer D3.

FIG. 5 also illustrates the bonding and interconnections within and between the first, second and third layers L1, L2, and L3 and other components of the 3D-IC 500. Bumps (e.g., solder balls) 540 attach the dies of the first layer L1 to the first interposer layer 502. Bumps 542 attach the dies of the second layer L2 to the second interposer layer 504. Bumps 544 attach the dies of the third layer L3 to the third interposer layer 506. Bumps 546 attach the stacked dies of the first layer L1. Bumps 548 attach the stacked dies of the second layer L2. Bumps 550 attach the stacked dies of the third layer L3. Bumps 552 attach the dies of the first layer L1 to the second interposer layer 504. Bumps 554 attach the dies of the second layer L2 to the third interposer layer 506. Bumps 558 attach the first interposer layer 502 to a SiP substrate 556. Bumps 562 attach the SiP substrate 556 to a circuit board 560.

The peripheral switches (e.g., crossbar switches, field programmable switches, or other dynamically switchable switches) can be used to reroute signals between layers by dynamically coupling at least one signal path on one layer (e.g., a signal bus, a test signal path, a power distribution path, etc.) to at least one signal path on at least one other layer. Thus, the 3D-IC 500 can be reprogrammable for different applications.

In this architecture, a PDN can be routed from the bottom substrate through vertical peripheral switches and horizontal interposers to supply power to upper dies. Thus, this architecture may significantly reduce the PDN area in the bottom active dies and mitigate routing congestion problems. Moreover, for multi-core architectures (e.g., quad core processors, etc.) each fabricated layer (e.g., die) in a 3D-IC can be identical (the peripheral switches may subsequently be programmed to provide the desired routing). Thus, in contrast to the architecture of FIG. 4, a 3D-IC constructed in accordance with the teachings herein may be easier to design and manufacture.

Other types of signals (i.e., not just PDN signals) can be routed through peripheral switches in accordance with the teachings herein. For example, critical signals could be routed to different dies through the interposer and peripheral switch.

A voltage control circuit and regulator can be integrated into a peripheral switch to supply different voltages to the individual die. Moreover, a peripheral switch can include an additional level shifter and a storage unit to transfer the signals among different power domains and even store the data before shut down of the individual die.

Advantageously, a peripheral switch can be implemented using a low cost, main stream process with large feature geometry. Consequently, the disclosed architecture is highly suitable for voltage regulator implementations and reduced product cost. Moreover, a peripheral switch can be implemented in different 3D-ICs to improve the overall flexibility.

From a testing perspective, the disclosed architecture not only increases design feasibility, it can facilitate bypassing a failed die and rerouting the signals to preserve the overall integrity of the IC. This functionality is valuable in the chip bring-up stage since it can be used to isolate the verification target and identify the root cause of a failure.

In view of the above, peripheral switching as taught herein supports a multiple voltage supply mechanism as well as programmable routing for heterogeneous integration. In some aspects, peripheral switching as taught herein can provide predefined dynamic power control and a routing switch center. Moreover, several dies with different functionality can integrated into single package without some of the routing congestion and heat dissipation problems seen in conventional architectures.

Figure 6:
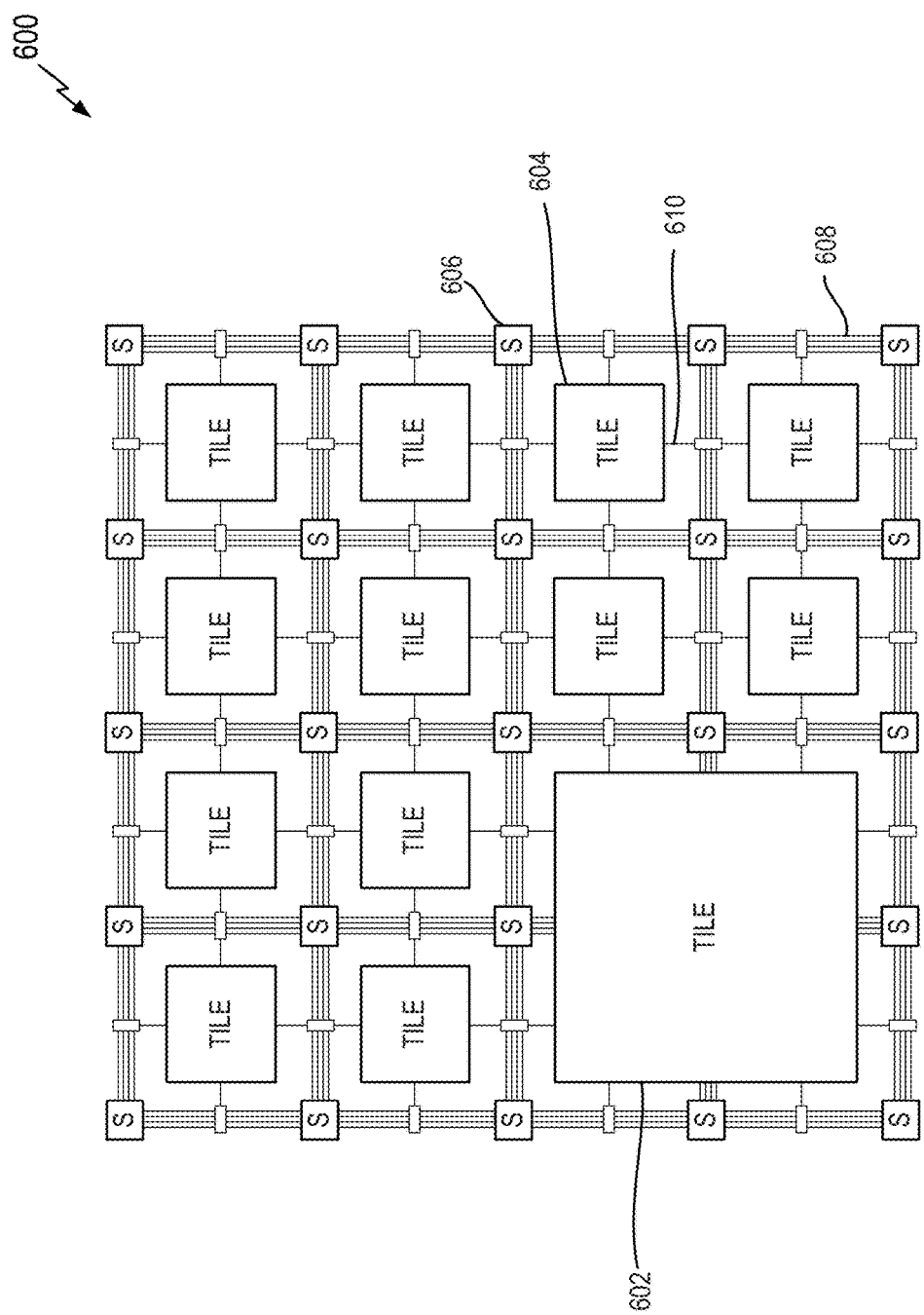
FIG. 6 is a plan view of an example of a 3D-IC in accordance with some aspects of the disclosure.
Figure 7:
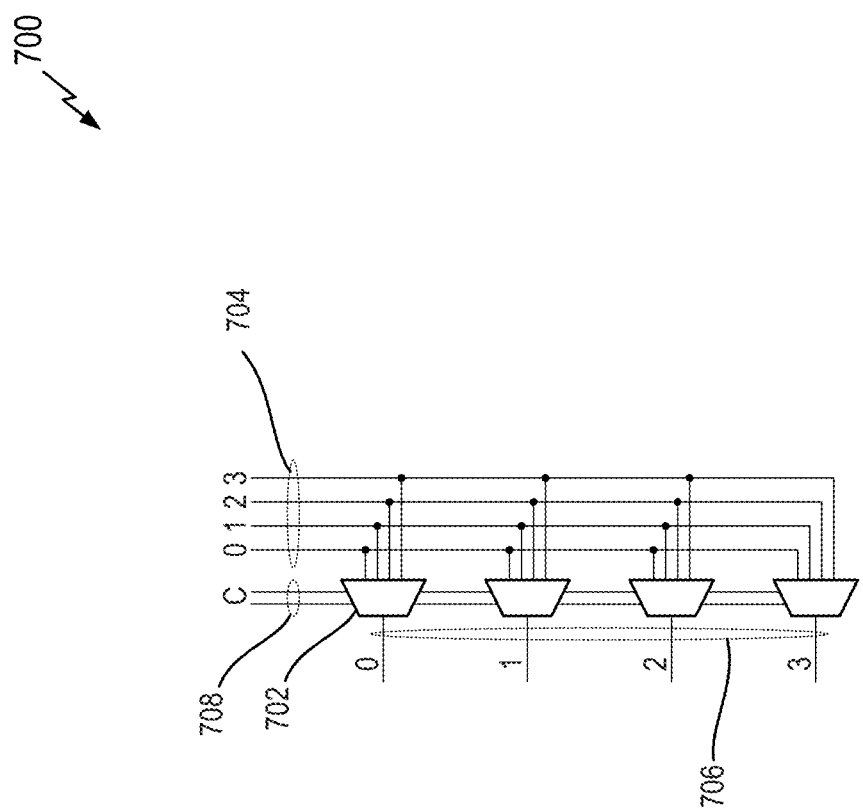
FIG. 7 is a schematic representation of an example of a switch in accordance with some aspects of the disclosure.
Figure 8:
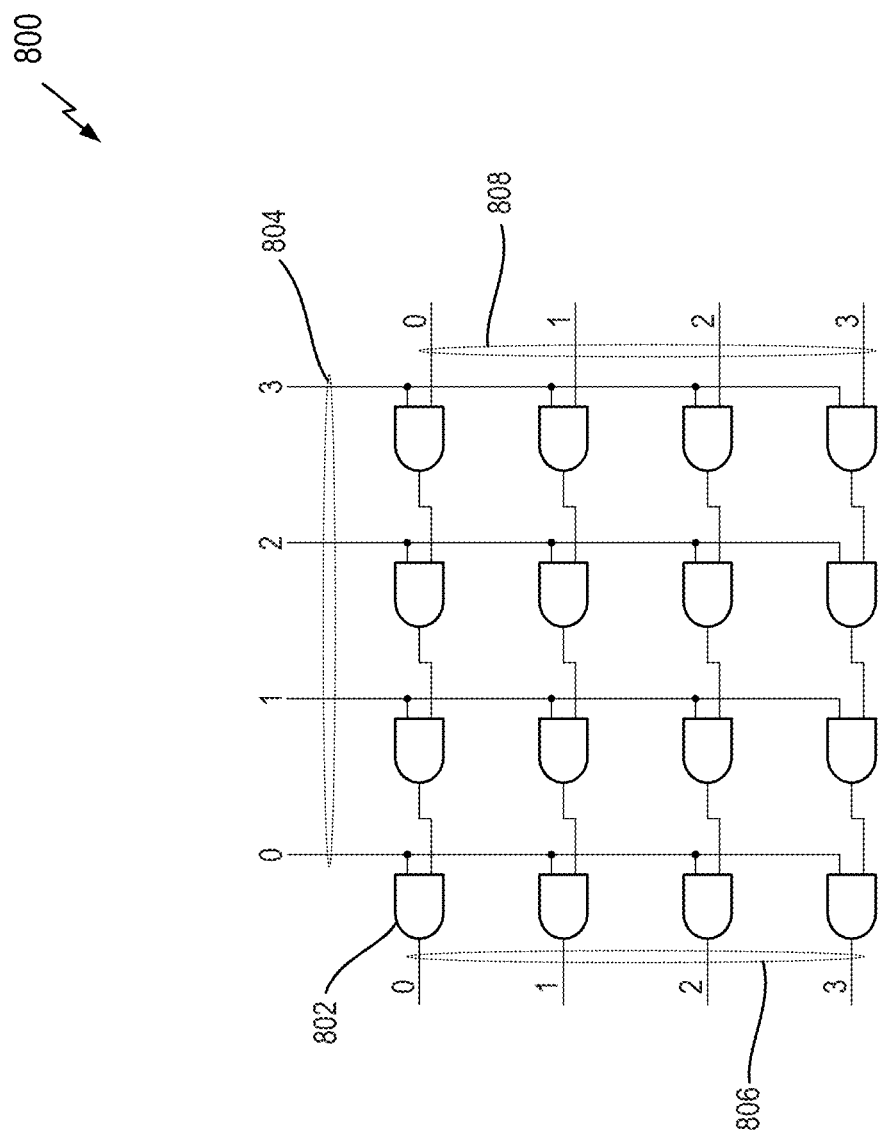
FIG. 8 is a schematic representation of another example of a switch in accordance with some aspects of the disclosure.

FIG. 6 is a plan view of an example of a 3D-IC 600 in accordance with some aspects of the disclosure. Logic circuits or other types of circuits are represented by the larger tiles (e.g., the largest tile 602 and a medium-sized tile 604). Peripheral switches (S) are represented by the smaller tiles (e.g., the peripheral switch 606). Routing tracks (e.g., a routing track 608) between peripheral switches and/or other circuits are also indicated, as well as input/output (I/O) connections (e.g., an I/O connection 610) between circuits and routing tracks. In some aspects, a peripheral switch may couple any of the routing tracks from one side (e.g., top, bottom, left or right) of the switch to any other routing track or I/O connection on another side of the switch. FIGS. 7 and 8 illustrate two examples of the peripheral switch 606.

FIG. 7 illustrates an example of a routing switch 700 (e.g., the peripheral switch 606) that includes a series of 4:1 multiplexers (e.g., a multiplexer 702). Each multiplexer couples one of four inputs 704 to a corresponding output 706 according to control signals 708. Thus, in operation, a logic circuit on the die or some other circuit generates the control signals 708 to dynamically control which tracks (e.g., one or more of the routing tracks of FIG. 6) the routing switch 700 will couple together at a given point in time. It should be appreciated that a routing switch may take other forms in other implementations.

FIG. 8 illustrates an example of a power switch 800 (e.g., the peripheral switch 606) that includes a series of two input control gates (e.g., a control gate 802). In some implementations, the control gates are AND gates. The control gates couple power from a given input 804 to a given output 806 according to control signals 808. Thus, in operation, a logic circuit on the die or some other circuit generates the control signals 808 to dynamically control which tracks (e.g., one or more of the routing tracks of FIG. 6) the power switch 800 may couple together at a given point in time. It should be appreciated that a power switch may take other forms in other implementations.

Figure 9:
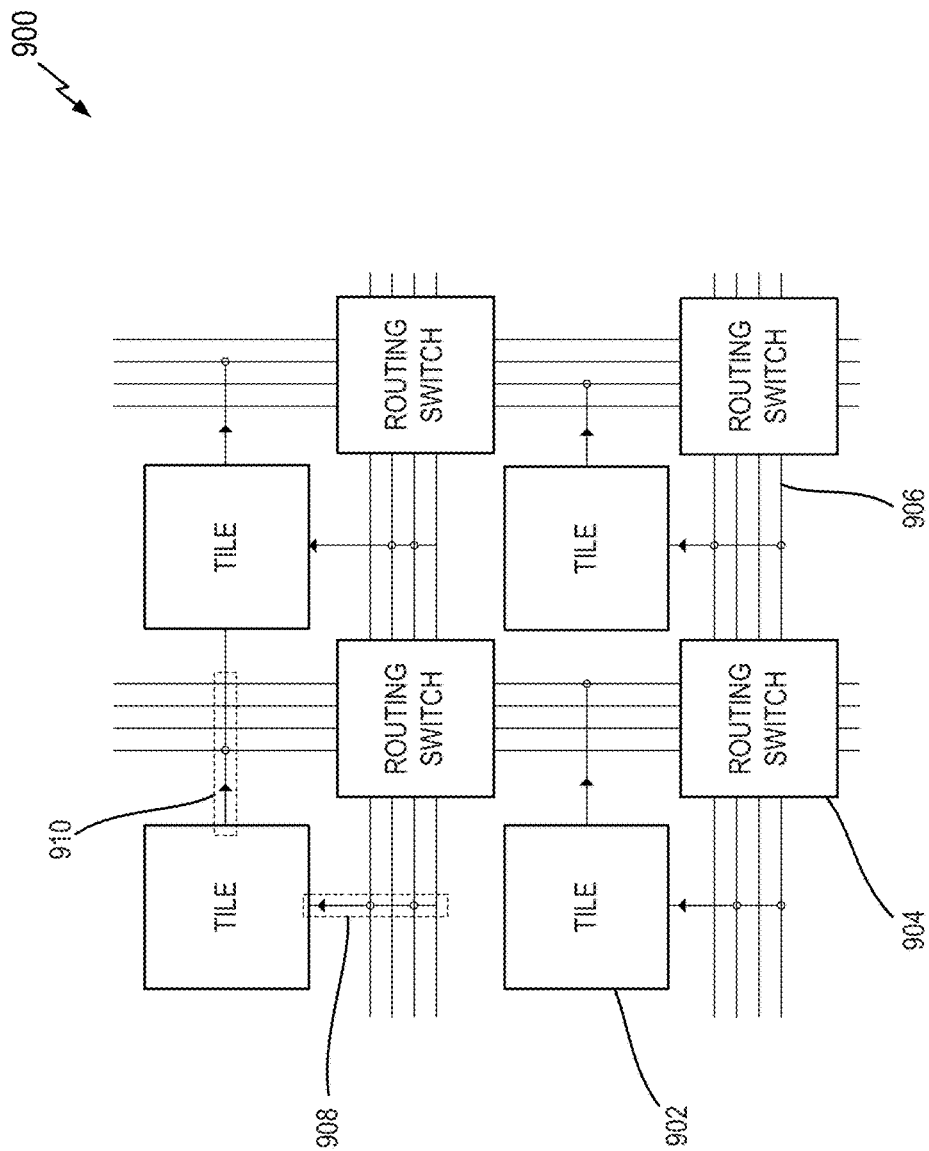
FIG. 9 is a plan view of an example of routing between circuits and switches in accordance with some aspects of the disclosure.

FIG. 9 is a plan view of an example of peripheral switches in a 3D-IC 900 in accordance with some aspects of the disclosure. Logic blocks or other types of circuits are represented by the tiles (e.g., a tile 902). Peripheral switches are represented by programmable routing switches (e.g., a routing switch 904) disposed between the tiles. This figure also shows signal paths (e.g., a routing track 906) that connect to the logic blocks (or other circuits) and the peripheral switches. FIG. 9 also illustrates I/O connections for the tiles including input connections (e.g., an input connection 908) and output connections (e.g., an output connection 910).

Referring now to FIG. 10, in some aspects, each of the peripheral switches (switch circuits) may be dynamically switchable. For example, a switch circuit may take the form of a crossbar switch and/or a field programmable switch. In some aspects, a switch circuit may selectively couple signals to another circuit (e.g., at least one logic circuit, at least one digital circuit, at least one analog circuit, etc.). In some aspects, a switch circuit may selectively couple signals to another layer (e.g., to a switch circuit on another die).

FIG. 10 is a schematic representation of an example of dynamically programmable switches in a 3D-IC 1000 in accordance with some aspects of the disclosure. FIG. 10 includes a plan view as shown in FIG. 10A, and a side sectional view as shown in FIG. 10B taken from the view A-A of FIG. 10A. The 3D-IC includes a first layer (e.g., die) 1002 and a second layer (e.g., die) 1004 stacked on top of the first layer 1002.

Dynamically programmable switches (DPSs) are distributed throughout each layer in the horizontal direction (from this view). For example, the second layer 1004 includes DPSs 1006 and 1008, while the first layer 1002 includes DPSs 1012 and 1014. This facilitates connectivity with other components on the respective layer.

As indicated in FIG. 10B, dynamically programmable switches (e.g., switches 1006 and 1012 and switches 1008 and 1014) are stacked in the vertical direction (from this view). This facilitates connectivity between layers, thus enabling signals to be dynamically switched across layers. As represented by the signal paths (e.g., the signal paths 1016 and 1018) between circuits (e.g., the circuits 1020 and 1022) and the dynamically programmable switches (e.g., the switches 1006 and 1012), one or more of the circuits of the 3D-IC 1000 may control the dynamically programmable switches. As represented by the signal paths (e.g., the signal path 1024) between the dynamically programmable switches (e.g., the switches 1008 and 1014), one or more of the dynamically programmable switches may control another dynamically programmable switch or route corresponding control signals thereto.

Figure 11:
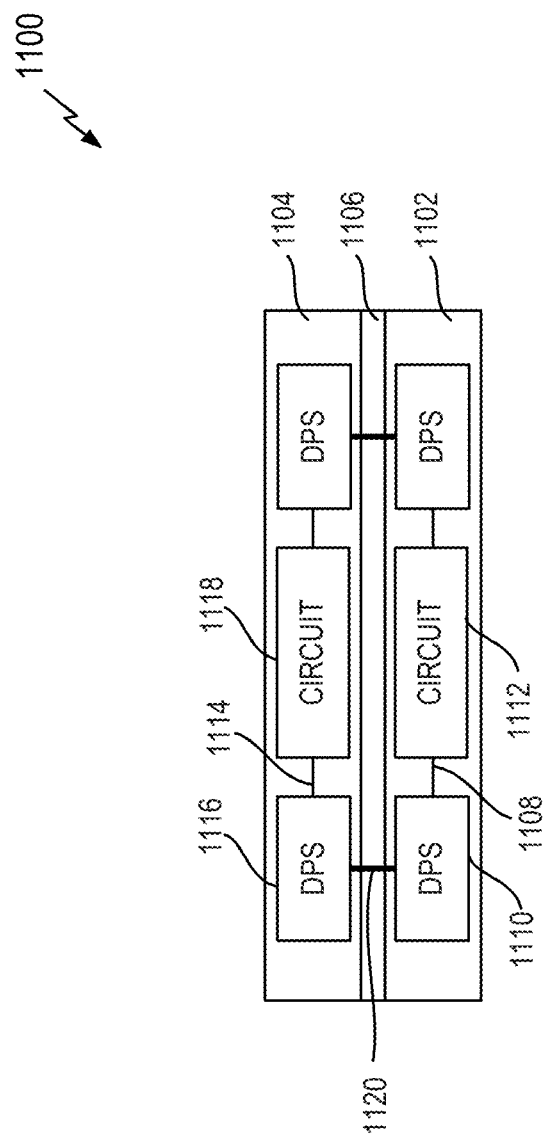
FIG. 11 is a side sectional schematic representation of signal path routing in a 3D-IC in accordance with some aspects of the disclosure.

Through the use of such dynamically programmable switches, signal paths on different layers can be dynamically coupled and decoupled. An example of these signal paths is depicted in FIG. 11 where a first die layer 1102 and a second die layer 1104 are coupled to an interposer (interposer layer) 1106. Here, a first signal path 1108 of the first die layer 1102 is electrically coupled to a first switch circuit (DPS) 1110. For example, the first signal path 1108 may be a signal bus, a test signal path, a power distribution path, or some other signal path that is electrically coupled to a first circuit 1112 (e.g., at least one logic circuit, at least one digital circuit, at least one analog circuit, etc.). A second signal path 1114 of the second die layer 1104 is electrically coupled to a second switch circuit 1116. For example, the second signal path 1114 may be electrically coupled to a second circuit 1118 (e.g., at least one logic circuit, at least one digital circuit, at least one analog circuit, etc.). A third signal path 1120 is routed from the first die layer 1102 to the second die layer 1104 through the interposer 1106, thereby electrically coupling the first switch circuit 1110 and the second switch circuit 1116. Thus, the first signal path 1108 may be dynamically coupled to and uncoupled from the second signal path 1114.

Figure 12:
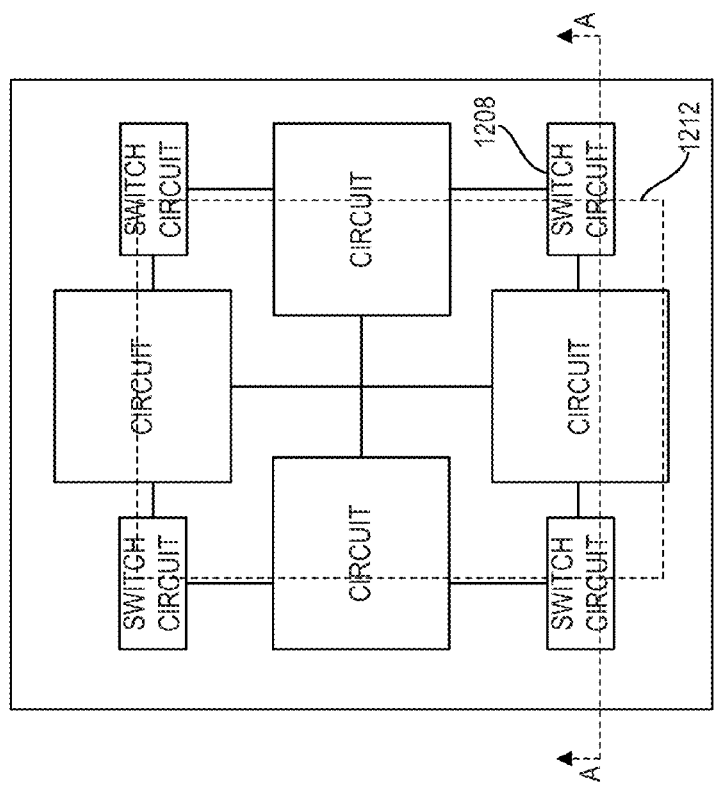
FIG. 12, including the plan view of FIG. 12A and the side sectional view of FIG. 12B, is a schematic representation of an example of switches located at a periphery of a 3D-IC in accordance with some aspects of the disclosure.

Referring to FIG. 12, in some aspects, each of the switch circuits may be located at a periphery of a die. In this way, heat dissipation on the die may be improved and routing congestion on the die may be mitigated as compared to conventional architectures. For example, by locating the switch circuits in this manner, improved heat transfer may be achieved from the center to the edge of the IC package (e.g., through an RDL and TSVs). Moreover, this scheme is much simpler than micro-channel solutions for thermal management.

FIG. 12 is a schematic representation of an example of switches located at a periphery of a 3D-IC 1200 in accordance with some aspects of the disclosure. FIG. 12 includes a plan view as shown in FIG. 12A, and a side sectional view as shown in FIG. 12B taken from the view A-A of FIG. 12A.

The 3D-IC 1200 includes a first layer (e.g., die) 1202 and a second layer (e.g., die) 1204. As indicated, a first switch circuit 1206 is located at a first periphery 1210 of the first layer 1202, and a second switch circuit 1208 is located at a second periphery 1212 of the second layer 1204.

In some aspects, switch circuits may be used in a power distribution network of a 3D-IC to distribute power to other circuits (e.g., at least one logic circuit, at least one digital circuit, at least one analog circuit, etc.). FIG. 13 is a schematic representation of an example of power distribution in a 3D-IC 1300 in accordance with some aspects of the disclosure. FIG. 13 includes a plan view as shown in FIG. 13A, and a side sectional view as shown in FIG. 13B taken from the view A-A of FIG. 13A.

The 3D-IC 1300 includes a first layer (e.g., die) 1302 and a second layer (e.g., die) 1304. As indicated, a first power distribution path 1306 (e.g., for providing power to a first circuit 1308) of the second layer 1304 is electrically coupled to a first switch circuit 1310. Similarly, a second power distribution path 1312 (e.g., for providing power to a second circuit 1314) of the first layer 1302 is electrically coupled to a second switch circuit 1316. In addition, a third power distribution path 1318 electrically couples the first switch circuit 1310 and the second switch circuit 1316. Thus, power may be dynamically switched between layers as needed.

In some aspects, one or more of the switch circuits may each include a power control circuit for supplying power to a corresponding layer (e.g., die layer). FIG. 14 is a schematic representation of an example of power control circuits in a 3D-IC 1400 in accordance with some aspects of the disclosure. FIG. 14 includes a plan view as shown in FIG. 14A, and a side sectional view as shown in FIG. 14B taken from the view A-A of FIG. 14A.

The 3D-IC 1400 includes a first layer (e.g., die) 1402 and a second layer (e.g., die) 1404. As indicated, a first switch circuit 1406 on the first layer 1402 includes a first supply voltage control circuit (SVCC) 1410, and a second switch circuit 1408 on the second layer 1404 includes a second supply voltage control circuit 1412. Thus, the first SVCC 1410 may control power supplied to a first circuit 1414 (e.g., at least one logic circuit, at least one digital circuit, at least one analog circuit, etc.) via a first supply path 1416 on the first layer 1402. In addition, the second SVCC 1412 may control power supplied to a second circuit 1418 (e.g., at least one logic circuit, at least one digital circuit, at least one analog circuit, etc.) via a second supply path 1420 on the second layer 1404. Accordingly, independent power control can be provided on a layer-by-layer basis through the use of peripheral switches as taught herein. Moreover, in some aspects, the first SVCC 1410 and the second SVCC 1412 may cooperate via signaling 1422 to provide power to the different layers.

Figure 15:
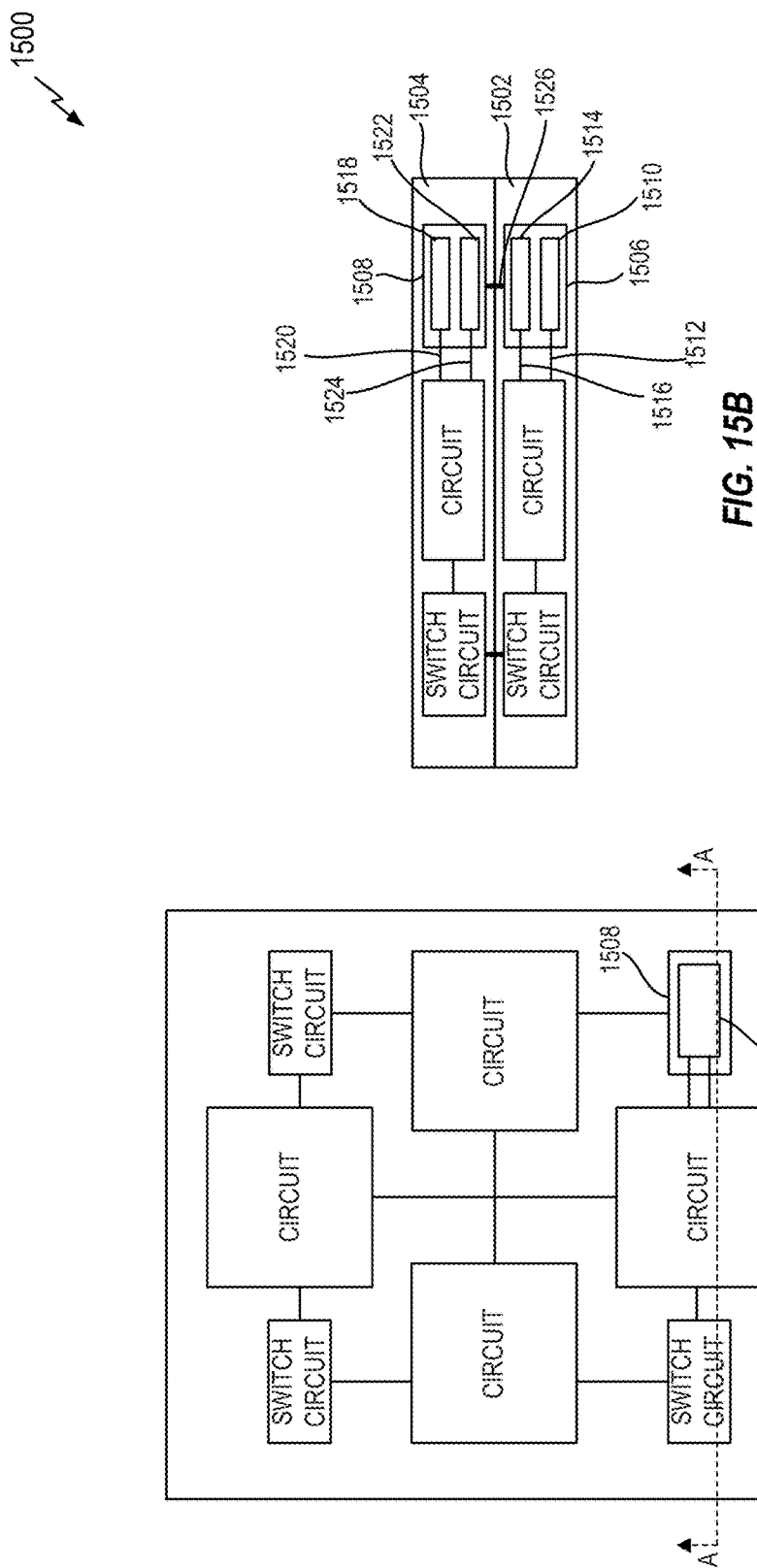
FIG. 15, including the plan view of FIG. 15A and the side sectional view of FIG. 15B, is a schematic representation of an example of multi-level supply voltage circuits in a 3D-IC in accordance with some aspects of the disclosure.

Referring to FIG. 15, in some aspects, more than one power supply voltage level may be used on a given die. For example, one or more of the supply voltage control circuits of FIG. 14 may each generate a plurality of supply voltage levels used by different voltage domains on a respective die.

FIG. 15 is a schematic representation of an example of multi-level supply voltage circuits in a 3D-IC 1500 in accordance with some aspects of the disclosure. FIG. 15 includes a plan view as shown in FIG. 15A, and a side sectional view as shown in FIG. 15B taken from the view A-A of FIG. 15A.

The 3D-IC 1500 includes a first layer (e.g., die) 1502 and a second layer (e.g., die) 1504. As indicated, a first switch circuit 1506 on the first layer 1502 includes a first voltage supply circuit 1510 coupled to a first supply path 1512 of the first layer 1502 and a second voltage supply circuit 1514 coupled to a second supply path 1516 of the first layer 1502. Similarly, a second switch circuit 1508 on the second layer 1504 includes a first voltage supply circuit 1518 coupled to a first supply path 1520 of the second layer 1504 and a second voltage supply circuit 1522 coupled to a second supply path 1524 of the second layer 1504. Thus, different power levels can be independently provided on a layer-by-layer basis through the use of peripheral switches as taught herein. For example, different dies manufactured using different processes may employ different power levels (e.g., 3.5 V versus 1.8 V). Accordingly, a single power supply voltage (e.g., a main supply signal 1526) could be supplied to the peripheral switches whereby the voltage supply circuit (s) on each peripheral switch provides the appropriate voltage level(s) for the die(s) on the corresponding level.

Referring to FIG. 16, in some aspects, one or more of the switch circuits may each include a voltage shifter circuit that is used to shift the level of a signal on a respective die. For example, the level of a signal may need to be shifted to accommodate different voltage domains (e.g., on different dies) that use different supply voltage levels.

FIG. 16 is a schematic representation of an example of signal level shifter circuits in a 3D-IC 1600 in accordance with some aspects of the disclosure. FIG. 16 includes a plan view as shown in FIG. 16A, and a side sectional view as shown in FIG. 16B taken from the view A-A of FIG. 16A.

The 3D-IC 1600 includes a first layer (e.g., die) 1602 and a second layer (e.g., die) 1604. As indicated, a first switch circuit 1606 on the first layer 1602 includes a first voltage level shifter (VLS) 1610 coupled to a first signal path 1612 and a second signal path 1614 of the first layer 1602. Thus, the first VLS 1610 may shift the signaling level of a signal received on the first signal path 1612 (e.g., from one die) to a different signaling level and output the resulting signal on the second signal path 1614 (e.g., to a different die). Similarly, a second switch circuit 1608 on the second layer 1604 includes a second VLS 1616 coupled to a third signal path 1618 and a fourth signal path 1620 of the second layer 1604. Accordingly, the second VLS 1616 may shift the signaling level of a signal received on the third signal path 1618 to a different signaling level and output the resulting signal on the fourth signal path 1620.

Referring to FIG. 17, a memory device (e.g., a register file) can be included in a peripheral switch to store data. For example, data from a die may be stored in such a memory device prior to shutting down the individual die (e.g., due to a fault condition). FIG. 17 is a schematic representation of an example of memory circuits in a 3D-IC 1700 in accordance with some aspects of the disclosure. FIG. 17 includes a plan view as shown in FIG. 17A, and a side sectional view as shown in FIG. 17B taken from the view A-A of FIG. 17A.

The 3D-IC 1700 includes a first layer (e.g., die) 1702 and a second layer (e.g., die) 1704. As indicated, a first switch circuit 1706 on the first layer 1702 includes a first memory device (MD) 1710 that is coupled to a first signal path 1712 of the first layer 1702. Similarly, a second switch circuit 1708 on the second layer 1704 includes a second memory device 1714 that is coupled to a second signal path 1716 of the second layer 1704. Accordingly, data from a first circuit 1718 (e.g., at least one logic circuit, at least one digital circuit, at least one analog circuit, etc.) on the first layer 1702 and/or a second circuit 1720 (e.g., at least one logic circuit, at least one digital circuit, at least one analog circuit, etc.) on the second layer 1704 may be stored in the first MD 1710 and/or the second MD 1714.

Figure 18:
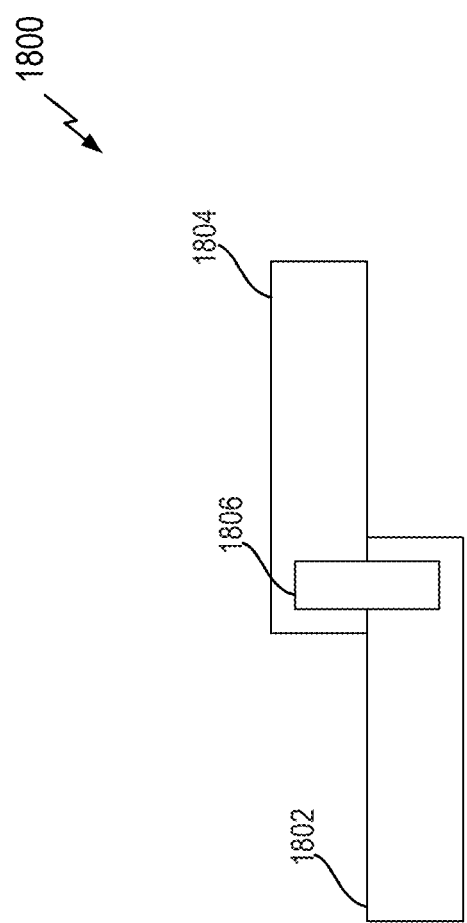
FIG. 18 is a side view of an example of offset dies in accordance with some aspects of the disclosure.
Figure 19:
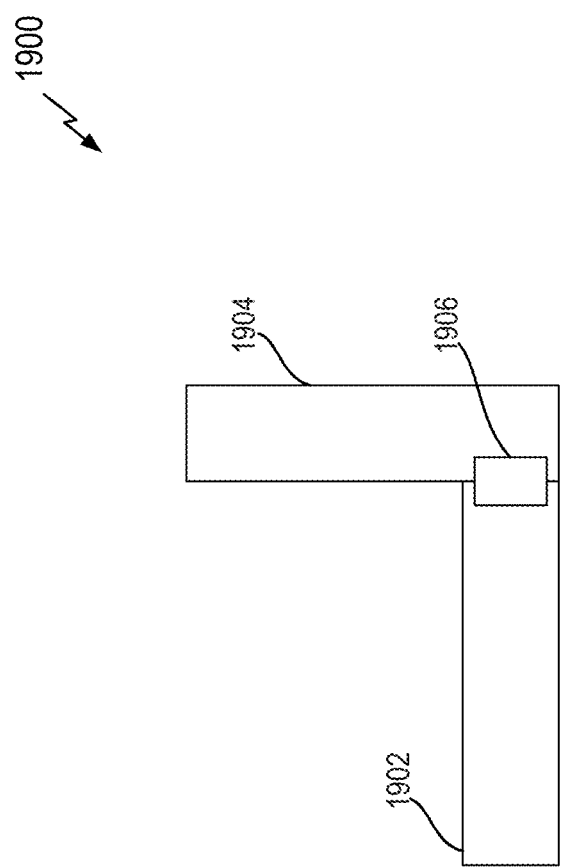
FIG. 19 is a side view of an example of dies in different geometric planes in accordance with some aspects of the disclosure.

As mentioned above, dies may be oriented with respect to each other in different ways in different implementations. FIGS. 18-20 illustrate three non-limiting examples of potential orientations.

FIG. 18 is a side view of an example of offset dies 1800 in accordance with some aspects of the disclosure. Here, a first die 1802 is offset (horizontally in this view) from a second die 1804. In accordance with the teachings herein, at least one peripheral switch 1806 is included in and/or coupled to each of the first and second dies 1802 and 1804.

FIG. 19 is a side view of an example of dies in different geometric planes 1900 in accordance with some aspects of the disclosure. In this case, a first die 1902 is at a right angle to a second die 1904. In accordance with the teachings herein, at least one peripheral switch 1906 is included in and/or coupled to each of the first and second dies 1902 and 1904.

FIG. 20 is an example of dies in different geometric planes 2000 in accordance with some aspects of the disclosure. FIG. 20 includes a perspective view as shown in FIG. 20A, and a plan view as shown in FIG. 20B. In this example, a first die 2002, a second die 2004, and a third die 2006 are all at right angles with respect to one another. In accordance with the teachings herein, at least one peripheral switch 2008 is included in and/or coupled to each of the first die 2002, the second die 2004, and the third die 2006.

It should be appreciated that dies need not be disposed at right angles as shown in FIGS. 19 and 20. Rather, it may be advantageous to route dies at other angles in some implementations.

Currently, integrated circuit technology is dominated by aggressive scaling of features sizes. In contrast to device and local interconnection, global interconnection in a 2D system-on-chip (SoC) is not scaled accordingly. Hence, global interconnection has become a speed and power bottleneck. One way to overcome such interconnection scaling barrier is to use 3D-ICs, which provide high vertical interconnection density between device ties using through silicon vias (TSVs). Moreover, 3D-ICs potentially offer higher integration density, a smaller footprint, faster speed, and lower power consumption.

The 3D-IC developed from a 2.5D architecture, where the 2.5D architecture is an implementation of the system-in-package (SiP) concept. 3D technologies may include die stacking, wafer stacking, and monolithic integration. While die stacking 3D may be employed in 3D technology, the μm-scale TSVs restrict the number of interconnections that can be replaced by TSVs. Monolithic 3D technology has emerged to achieve the full potential of the third dimension at transistor scale. Monolithic 3D technology, with nano-scale TSVs, offers a high density of device-dimension vertical interconnects, may facilitate improved assembly of transistors and interconnects in a 3D volume.

While 3D-IC provides high vertical interconnection density between device ties using TSV, making global interconnection shorter and faster, another problem arises as the adoption of 3D architecture leads to increased power densities that can result from placing one high power density block over another in the multi-layered 3D stack. That is, the thermal management problem that is already a concern in 2D architectures may be accentuated when moving to the 3D architecture. Besides the thermal management problem, power consumption has been a concern in IC design, and thus, the low power challenge remains in 3D design architecture. As device size has been scaled down, a large portion of power consumption is now due to leakage power. Sleep transistors may be introduced as a common approach to alleviate this situation. By turning off part of the circuit that is not in functional use through sleep transistors, the leakage power can be effectively decreased. However, inserting sleep transistors can cause extra consumption of area and power of the design.

Floorplans aimed at solving the 3D thermal management problem may be available. For example, in one thermal-aware floorplan for 3D architectures, a parameter that evaluates the temperature approximation of each circuit layer may be added to a Simulated Annealing (SA) floorplan algorithm. Interconnect power consumption may also be considered in this previous floorplan. In another example, a 3D floorplan representation (e.g., Combined Bucket and 2D Array (CBA)) may realize thermal consideration by calculating the temperature distribution of the circuit and putting a thermal constraint on the SA cost function based on CBA. In another example, an architecture for power network in 3D-IC may include a thermal distribution network model. Based on the thermal network, thermal TSVs are placed at locations with maximum temperature gradient vertically among tiers to provide thermal dissipation paths.

According to aspects of the present disclosure, a 2D and monolithic 3D hybrid reconfigurable integrated circuit architecture is provided that takes advantage of the 2D reconfigurable structure and the monolithic 3D interconnection. At an architecture level, the structure of the present disclosure may allow different modules to integrate together using a stacked interposer. Moreover, modules may be dynamically connected together using reconfigurable peripheral switches, and power rails and signal paths can be routed to different modules similar to field programmable gate array. At a block level (e.g., circuits or logic blocks) and device level, the novel structure may save area by employing a 3D architecture. Moreover, the power network problem suffered by 3D-IC may be solved by routing power rails through peripheral switches.

Another benefit obtained by the structure is the alleviation of the thermal management problem. The novel hybrid structure may include a hierarchical 3D architecture, with modules on different interposer layers, and blocks (e.g., circuits or logic blocks) and devices within each module on different monolithic 3D device layers. This structure enables the use of a hierarchical 3D thermal aware floorplan that may place modules, blocks, and devices hierarchically based on a thermal condition. The flexibility offered by the architecture provides a large solution space for the thermal management problem, thus reaching an optimal thermal solution.

The corresponding thermal aware floorplan algorithm aims at, for example, solving thermal problems by taking the power correlation of functional blocks into consideration. For example, the blocks may be the circuits 108 included in the first die 102 or the circuits 114 included in the second die 104 of FIG. 1B above, or circuits included in any one of dies 2208, 2210, 2212, 2214, 2216, 2218, 2228, 2230, 2232, and 2234 of FIG. 22 below). The rationale of the method may include two parts: 1) Avoid the presence of hot spots by placing functional blocks with high power correlation but high block temperatures apart, so that a high temperature block may be surrounded by low temperature blocks, thus significantly decreasing the peak temperature of the chip; and 2) Decrease the number of necessary sleep transistors to save power and thermal dissipation by grouping the blocks with similar power behavior and letting one group share a sleep transistor.

Figure 21:
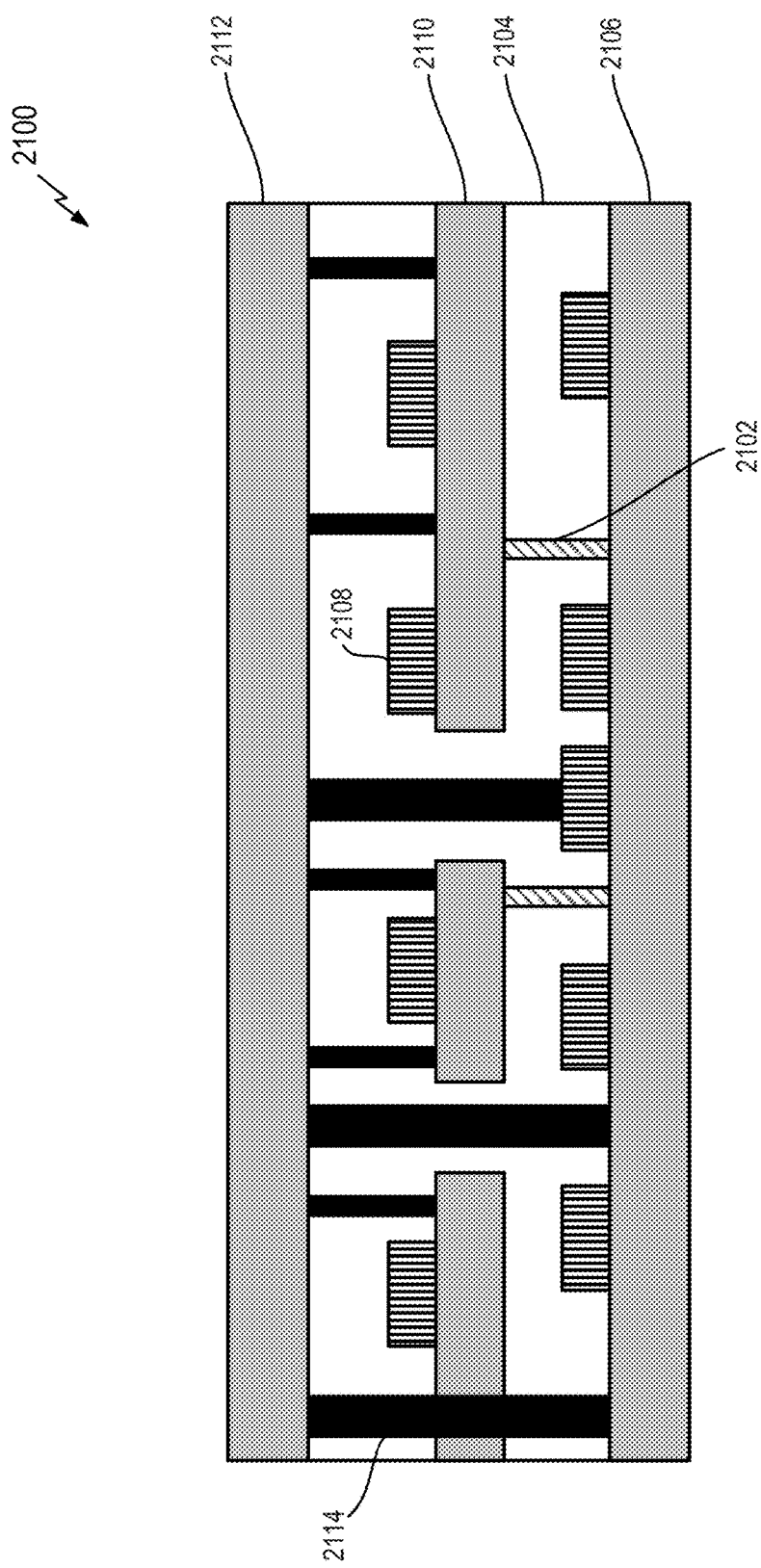
FIG. 21 is a diagram illustrating a monolithic 3D structure with dense vertical interconnections.

FIG. 21 is a diagram illustrating an example monolithic 3D structure 2100 with dense vertical interconnections. The example monolithic 3D structure includes an inter-layer connection 2102, an inter-layer dielectric 2104, a lower device layer 2106, a middle device layer 2110, an upper device layer 2112, and various circuits 2108. The upper layer device layer is electrically connected to the lower device layer 2106 by at least one TSV 2114.

A 3D technology may involve wafer stacking and die stacking. For wafer stacking, the distance between active devices in the third dimension is the thickness of a wafer, which can be on the order of several hundred microns. As standard cell technology nodes are scaled down, the long distance a wire traveled in the third dimension may hinder the 3D-IC to achieve its full potential. On the other hand, 3D-IC fabrication based on die stacking (stacking multiple two-dimensional dies vertically and connecting them with TSVs) may be used. Due to technology constraints, the TSVs are 5-50 μm diameter including a keep-out-zone. The large size of TSVs introduces significant parasitic loads that cut down the benefits that 3D integration can achieve.

In order to improve the potential of 3D architecture, a monolithic 3D structure may be utilized. The monolithic 3D structure directly constructs multiple device layers with ultra-dense vertical connectivity, as shown in FIG. 21. Monolithic integration is advantageous for, as an example, providing a miniature TSV (e.g., inter-layer connection 2102) that can be as small as 50 nm. The use of smaller TSVs equates to smaller parasitic loads. Smaller parasitic loads provide smaller influence on delay, which enables the replacement of local interconnects using TSVs. For example, when the TSV diameter is below 100 nm, significant area reduction may be achieved with little delay, power, and noise overhead using block level partitioning for monolithic 3D-ICs.

While monolithic 3D integration is an attractive technological option, processing obstacles may have posed roadblocks: circuits on upper layers may be fabricated at a low temperature (less than 400 degrees C.). Several approaches may address this problem. For example, carbon nanotube field-effect transistors (CNFETs) and non-volatile memory (NVM), such as Spin-Transfer Torque RAM (STTRAM) and Resistive RAM (RRAM), fabricated with a maximum processing temperature of less than 250 degrees C., may be used. In another example, high-quality upper layers may be designed either by seed windows techniques or low temperature molecular bonding.

Figure 22:
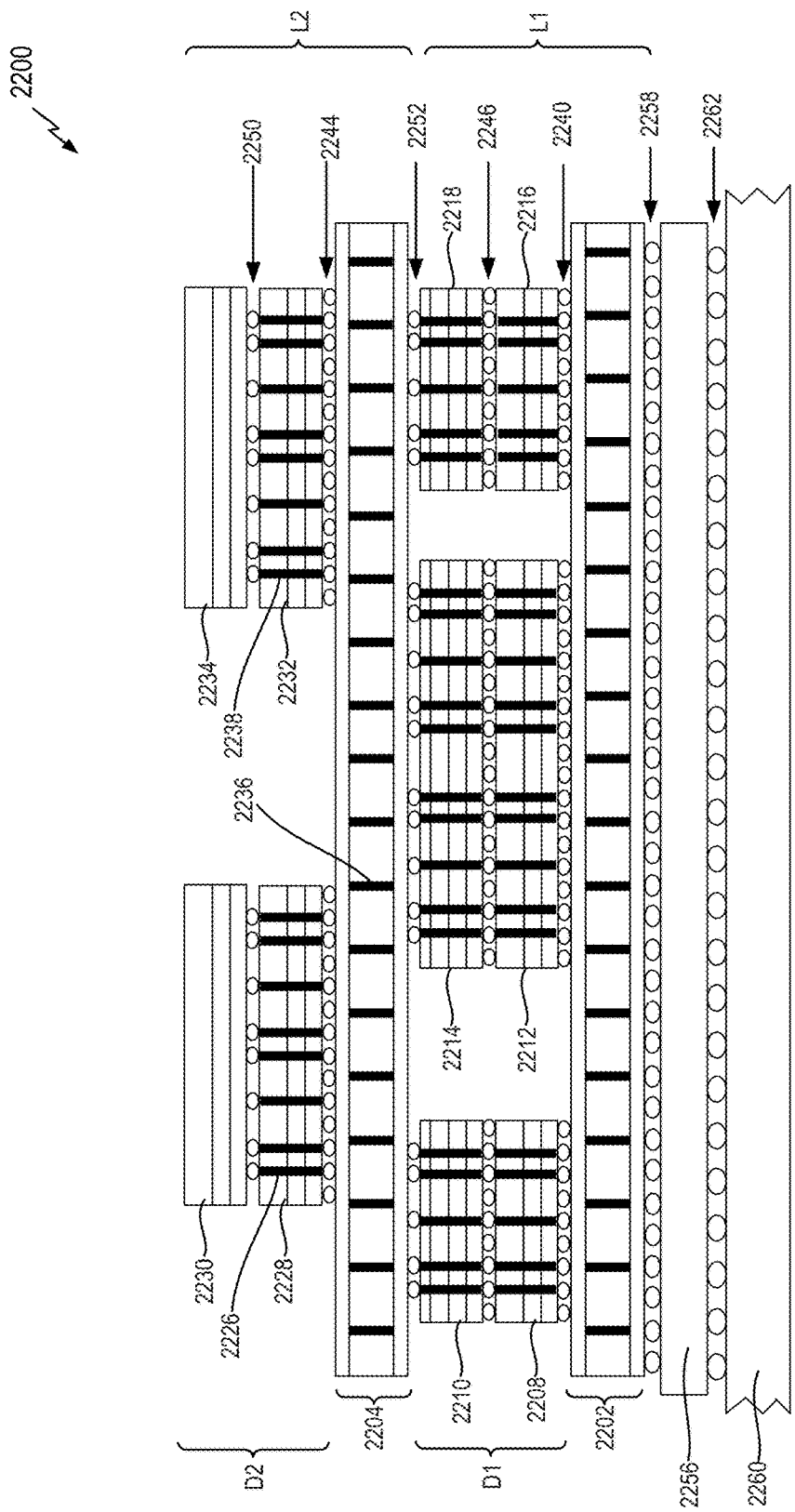
FIG. 22 is a side sectional view of an example of a 3D-IC hybrid reconfigurable architecture in accordance with some aspects of the disclosure.

FIG. 22 is a side sectional view of an example of a 3D-IC hybrid reconfigurable architecture 2200 in accordance with some aspects of the disclosure. The dies are stacked together using an interposer and connected using a redistribution layer (RDL) in the horizontal direction. Instead of routing the power and signal through the dies, additional reconfigurable peripheral switches may be used so that all the power rails and signal paths are routed through the switches from the lower level to the upper level in the vertical direction. Based on different requirements, the power rails and signal paths can be routed to various dies in the same package. Therefore, the single package can be used for multiple purposes by only modifying the routing. This approach can also bypass a false die and reroute all connections.

Referring to FIG. 22, the disclosure relates in some aspects to a 3D-IC hybrid architecture that includes programmable switch routing along with configuration advantages of the 2.5D and fully stacked 3D architectures. In some aspects, the architecture of FIG. 22 not only resolves PDN design and thermal management issues, but also provides additional power control and programmable routing capability for 3D-IC design.

In the side sectional view of FIG. 22, a 3D-IC 2200 includes a first layer L1 and a second layer L2 (horizontal planes in the perspective of FIG. 22). The first layer L1 includes a first interposer layer 2202 and a first die layer D1. The second layer L2 includes a second interposer layer 2204 and a second die layer D2.

The first layer L1 lies within a first geometric plane. The first interposer layer 2202 includes wire traces for electrically coupling dies 2208, 2210, 2212, 2214, 2216, and 2218 of the first die layer D1. At least two of the stacked dies (e.g., a first pair of stacked dies 2208 and 2210 and/or a second pair of stacked dies 2216 and 2218) include at least one peripheral switch for wire routing in another dimension (a vertical dimension in the perspective of FIG. 22) to connect the first layer L1 to the other layer. At least one of the dies (e.g., a third pair of stacked dies 2212 and 2214) includes at least one other circuit (e.g., at least one logic circuit, at least one digital circuit, at least one analog circuit, etc.).

The second layer L2 lies within a second geometric plane. The second interposer layer 2204 includes wire traces for electrically coupling dies 2228, 2230, 2232, and 2234 of the second die layer D2. A portion of a first pair of stacked dies 2228 and 2230 and/or a second pair of stacked dies 2232 and 2234 include at least one peripheral switch for wire routing in another dimension (a vertical dimension in the perspective of FIG. 22) to connect the second layer L2 to the other layer. Another portion of the first pair of stacked dies 2228 and 2230 and/or a second pair of stacked dies 2232 and 2234 includes at least one other circuit (e.g., at least one logic circuit, at least one digital circuit, at least one analog circuit, at least one memory circuit, etc.).

Each of the first and second layers L1 and L2 includes TSVs as represented by the thick vertical lines. For example, a TSV 2236 is specifically referenced in the second interposer layer 2204 and a TSV 2238 is specifically referenced in the second die layer D2.

FIG. 22 also illustrates the bonding and interconnections within and between the first and second layers L1 and L2 and other components of the 3D-IC 2200. Bumps (e.g., solder balls) 2240 attach the dies of the first layer L1 to the first interposer layer 2202. Bumps 2244 attach the dies of the second layer L2 to the second interposer layer 2204. Bumps 2246 attach the stacked dies of the first layer L1. Bumps 2250 attach the stacked dies of the second layer L2. Bumps 2252 attach the dies of the first layer L1 to the second interposer layer 2204. Bumps 2258 attach the first interposer layer 2202 to a SiP substrate 2256. Bumps 2262 attach the SiP substrate 2256 to a circuit board 2260.

The peripheral switches (e.g., crossbar switches, field programmable switches, or other dynamically switchable switches) can be used to reroute signals between layers by dynamically coupling at least one signal path on one layer (e.g., a signal bus, a test signal path, a power distribution path, etc.) to at least one signal path on at least one other layer. Thus, the 3D-IC 2200 can be reprogrammable for different applications.

In this architecture, a PDN can be routed from the bottom substrate through vertical peripheral switches and horizontal interposers to supply power to upper dies. Thus, this architecture may significantly reduce the PDN area in the bottom active dies and mitigate routing congestion problems. Moreover, for multi-core architectures (e.g., quad core processors, etc.) each fabricated layer (e.g., die) in a 3D-IC can be identical (the peripheral switches may subsequently be programmed to provide the desired routing). Other types of signals (i.e., not just PDN signals) can be routed through peripheral switches in accordance with the teachings herein. For example, critical signals could be routed to different dies through the interposer and peripheral switch.

A voltage control circuit and regulator can be integrated into a peripheral switch to supply different voltages to the individual die. Moreover, a peripheral switch can include an additional level shifter and a storage unit (e.g., register file) to transfer the signals among different power domains and even store the data before shut down of the individual die.

Advantageously, a peripheral switch can be implemented using a low cost, main stream process with large feature geometry. Consequently, the disclosed architecture is highly suitable for voltage regulator implementations and reduced product cost. Moreover, a peripheral switch can be implemented in different 3D-ICs to improve the overall flexibility.

Figure 23B:
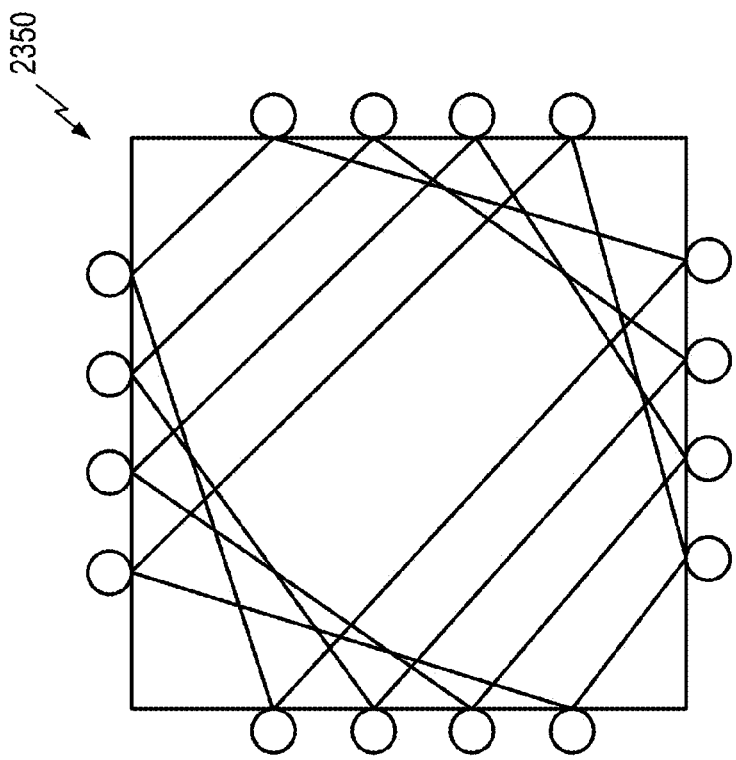
FIG. 23B is a diagram illustrating a device layer in the peripheral switch structure of FIG. 23A providing a horizontal connection.
Figure 23A:
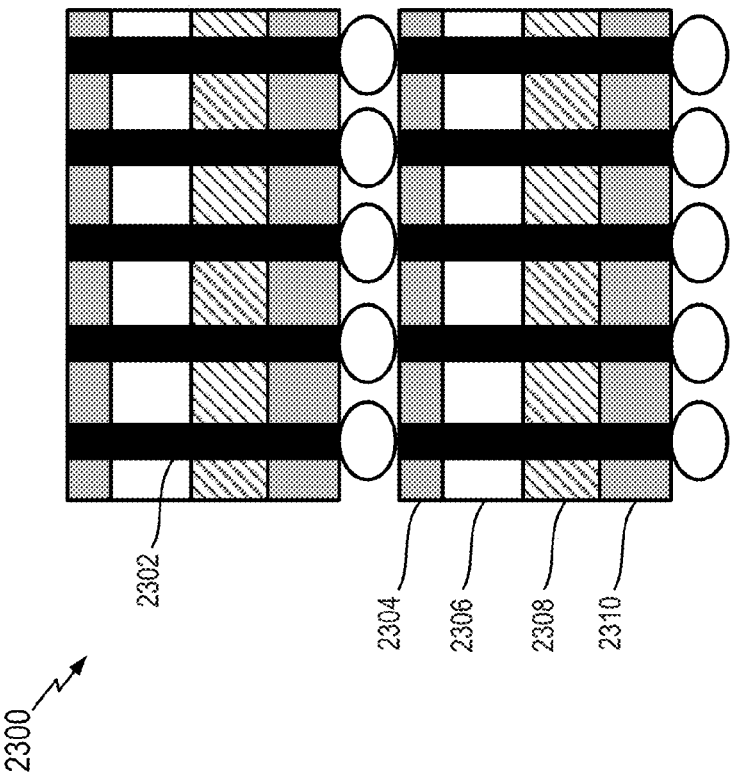
FIG. 23A is a diagram illustrating a 3D peripheral switch structure.

FIG. 23A is a diagram illustrating a 3D peripheral switch structure 2300. The 3D peripheral switch structure 2300 includes TSVs 2302, a backside metal layer 2304, a chip substrate 2306, a device layer 2308, and a standard metal layer 2310. FIG. 23B is a diagram 2350 illustrating a device layer 2308 in the peripheral switch structure 2300 providing horizontal connections.

Referring to FIGS. 23A and 23B, reconfigurable peripheral switches with 3D structures not only provide horizontal connections on each interposer layer, but also offers vertical interconnections that connect the upper and lower interposer layers. The vertical connections are provided by the TSVs through dies, which are controlled by the device layer 2308. Meanwhile, the device layer 2308 also provides the horizontal connections within the interposer layer.

A benefit of the reconfigurable structure may be, for example, that an identical die can be used for any package without modification. This significantly reduces design efforts and shortens development cycles. With this approach, stacking more dies in the same package is made easier without limitation. The expandable capability may be suitable for Internet of Everything (IOE) applications, since different modules suitable for different requirements can be created using the reconfigurable structure. For example, a design of a server may place two processor and two memory chips in a package. With the 3D reconfigurable architecture, two more memory chips can be added into the package without significant modification.

The reconfigurable 3D architecture may also solve the thermal management problems associated with traditional 3D-IC. In the reconfigurable 3D-IC architecture, the peripheral switches can be placed around the package for heat dissipation. This speeds up the heat transfer from the center to the edge of the package through the RDL and TSV. This mechanism is simpler than previous micro-channel solutions for thermal management. Moreover, when the function of one certain die is not required, such die can be shut down using a peripheral switch to save power and reduce thermal dissipation.

With the power and thermal management problems resolved by the reconfigurable structure, the combination of the monolithic 3D structure in each module may also enable area saving and improves delay. The hierarchical 3D structure realized by the combination of the 2.5D structure and the monolithic 3D structure may be implemented with a 3D floorplan, which may solve the thermal management problem further.

In an aspect, the 3D hybrid reconfigurable architecture may be combined with a thermal-aware algorithm. As such, dies with similar power behavior may be grouped together and the number of package pads needed are reduced by pad sharing. For example, a previous 2D design may use 19 pads, which consume a significant amount of power and cause thermal dissipation due to their large capacities. In contrast, by using the architecture of the present disclosure, the number of pads can be reduced by 25% of an original number of pads. This contributes to power saving.

The 3D reconfigurable architecture of the present disclosure may provide a reliable implementation approach for IOE applications. Moreover, the problem of thermal dissipation can be further alleviated by a novel thermal-aware floorplan. The thermal-aware floorplan is a simulated annealing algorithm based on a 3D-IC floorplan tree and block power correlation. As mentioned above, a block may be, for example, a circuit 108 included in the first die 102 or a circuit 114 included in the second die 104 of FIG. 1B above, or a circuit included in any one of dies 2208, 2210, 2212, 2214, 2216, 2218, 2228, 2230, 2232, and 2234 of FIG. 22 below).

Existing 3D floorplan trees may be designed based on 2D floorplan B*-trees. A B*-tree is an ordered binary tree that has a unique correspondence to a compacted floorplan. A 3D floorplan tree may be a 3D B*-tree, in which a 2D B*-tree is used for each tier of the 3D-IC. Modules within one tier are placed by the 2D B*-tree placement. But since a 3D floorplan may need a bigger solution space, the placement rule of the 3D B*-tree may be modified such that inter-tier swap and inter-tier movement are allowed.

According to aspects of the disclosure, a 3D tree structure (referred to as a ternary 3D tree) is provided. The ternary 3D tree may include four ternary trees. The ternary 3D tree structure may have the advantage of exchanging blocks in the same layer and different layers during the same step, instead of using a special inter-tier swap step to realize interlayer blocks changing in the 3D B*-tree.

The ternary tree may be a tree data structure in which each node has at most three child nodes. Although two ternary trees may be enough to determine a unique 3D floorplan, the two ternary trees may not be enough to easily identify invalid cases. Thus, four ternary trees may be used to represent one unique floorplan structure.

FIG. 24 is a diagram 2400 illustrating four ternary trees representing a unique and valid 3D floorplan. As shown in FIG. 24, a first ternary tree 2402, a second ternary tree 2404, a third ternary tree 2406, and a fourth ternary tree 2408 represent a 3D floorplan 2410. In the floorplan 2410, blocks A and F are diagonally adjacent. The four ternary trees are grown starting from four non-adjacent vertices. The arrows within each of the ternary trees 2402, 2404, 2406, and 2408 indicate the paths that connect four pairs of the cubic diagonal vertices.

3D-IC design may reduce global interconnect power. However, the stacking of multiple active layers may lead to higher power densities, which may become an obstacle for implementing the structure. With the fast development of 3D-IC technology, the thermal management problem may be addressed.

In one aspect, circuits having a similar power characteristic may be based on a power correlation coefficient. In an aspect, instead of directly putting temperature into an SA cost function, the thermal-aware 3D floorplan algorithm of the present disclosure explores a power correlation between different blocks, based on which more specific objectives to be optimized can be added in the SA cost function. By providing a power correlation coefficient, the repeated calculation of the chip peak temperature to evaluate the value of the cost function can be avoided. A utilization correlation between blocks can be defined by a Pearson correlation coefficient according to Equation (1) below:

$$\rho(i,j) = \frac{\text{cov}(i,j)}{\sigma_i \cdot \sigma_j} \quad (1)$$

After fetching data from simulation, a utilization per block table can be created as Table I. $\rho_{i\tau}$ is the power block i consumes during $t_\tau$.

TABLE I

| power correlation table | | | | | | |
|---|---|---|---|---|---|---|
| | $t_1$ | $t_2$ | $t_3$ | $t_4$ | — | $t_N$ |
| block$_1$ | $p_{11}$ | $p_{12}$ | $p_{13}$ | $p_{14}$ | — | $p_{1N}$ |
| block$_2$ | $p_{21}$ | $p_{22}$ | $p_{23}$ | $p_{24}$ | — | $p_{2N}$ |
| block$_M$ | $p_{M1}$ | $p_{M2}$ | $p_{M3}$ | $p_{M4}$ | — | $p_{MN}$ |

So cov(i, j) can be calculated according to Equation (2) below:

$$\text{cov}(i,j) = \sum_{\tau=1}^{N} p_{\tau i} \cdot q_{\tau j} - \frac{1}{N} \sum_{\tau=1}^{N} p_{\tau i} \sum_{\tau=1}^{N} q_{\tau j} \quad (2)$$

Equation (2) defines the co-variance matrix between blocks. The standard deviation of block$_i$ and block$_j$ are represented by $\sigma_i$ and $\sigma_j$, which can be calculated according to Equation (3) below:

$$\sigma_i = \sqrt{\sum_{\tau=1}^{N} \frac{p_{\tau i}^2}{N} - \left(\sum_{\tau=1}^{N} \frac{p_{\tau i}}{N}\right)^2} \quad (3)$$

After calculation, the power correlation coefficient between any two blocks in the design is determined. If the correlation coefficient is positive and near to 1, this implies that block$_i$ and block$_j$ tend to have similar utilization.

The thermal-aware algorithm operates hierarchically at block level as well as at chip level. At the block level, the power correlations between standard cells are calculated, then standard cells are arranged to reduce a sleep transistor number and decrease temperature. At the chip level, the power correlations between dies are calculated, so the number of peripheral switches can be reduced and the thermal management problem can be further relieved.

When floorplanning, a cost function that needs to be minimized in the SA algorithm is usually defined as $\Phi(A, W)=\alpha*A+\lambda*W$, which takes floorplanning area A and total wire length W into consideration. In an aspect of the disclosure, power correlation may be included in the cost function based on two rules as previously mentioned.

Figure 25B:
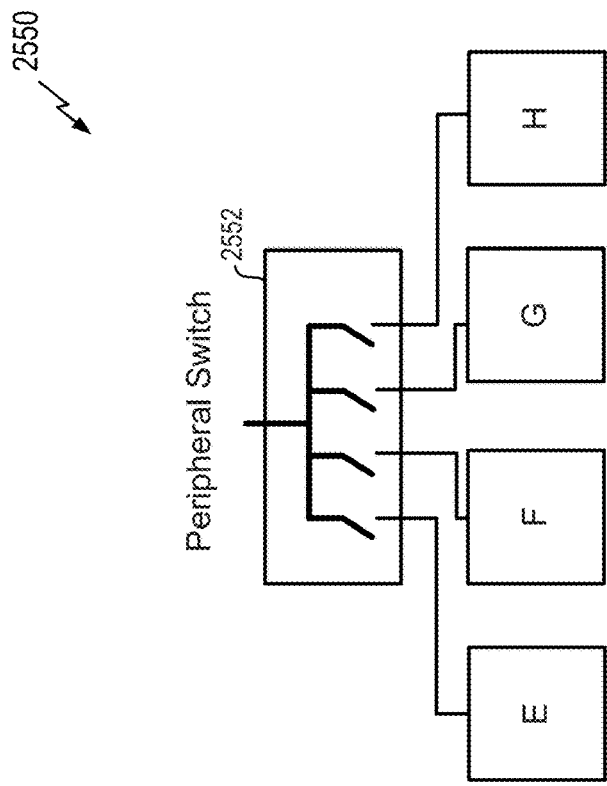
FIG. 25B is a diagram illustrating blocks with different power behaviors using different sleep transistors.
Figure 25A:
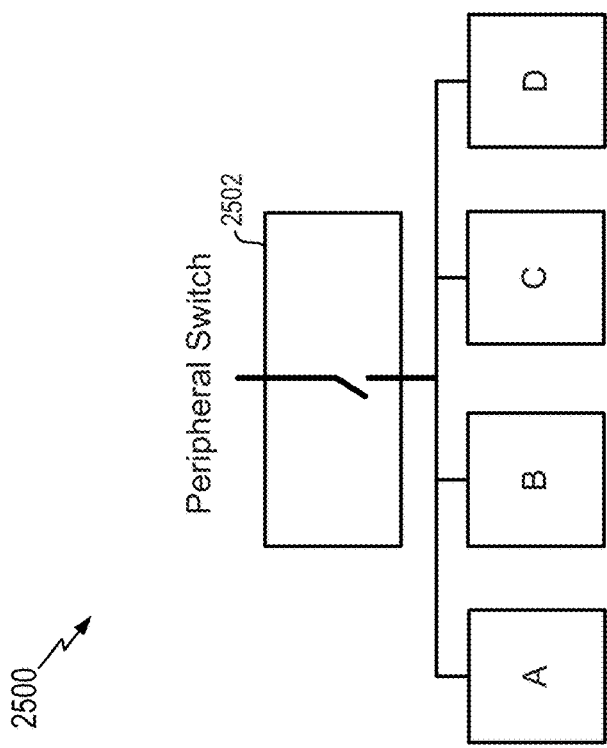
FIG. 25A is a diagram illustrating blocks with a similar power behavior sharing one sleep transistor.

Taking block level operation as an example, the rules may include: 1) Group blocks that have high power correlation to reduce the number of peripheral switches; and 2) Separate blocks with high power correlation but with a high block temperature to avoid a heat island. FIG. 25A is a diagram 2500 illustrating blocks A, B, C, and D with a similar power behavior sharing one sleep transistor 2502. FIG. 25B is a diagram 2550 illustrating blocks E, F, G, and H with different power behaviors using different sleep transistors 2552, since the blocks E, F, G, and H will be turned on and off alternatively.

In one aspect, circuits having a high temperature characteristic may be based on a thermal coefficient. A new cost function is shown in Equation (4) below:

$$C=\alpha \cdot \text{Wire} + \beta \cdot \text{Area} + \gamma \cdot \Sigma \rho_{ij} \cdot \text{Adj}_{ij} + \mu \cdot \Sigma \rho_{ij} \cdot d_{ij} \cdot s_i \cdot s_j \quad (4)$$

In Equation (4), $\rho_{ij}$ is the power correlation between $block_i$ and $block_j$. $Adj_{ij}$ is a Boolean parameter, wherein $Adj_{ij}=0$ when block and block are apart. $d_{ij}$ is the geometry distance between two $block_i$ and $block_j$. $s_i$ is the thermal coefficient of $block_i$.

To realize the first rule, the parameter $\gamma$ may be added as positive. Accordingly, blocks with high power correlation may be placed adjacent to each other to reduce cost. For the second rule, the parameter $\mu$ may be added as negative. Accordingly, blocks that tend to have high temperature may be put together with blocks that have negative power behavior to minimize the cost function.

Figure 26:
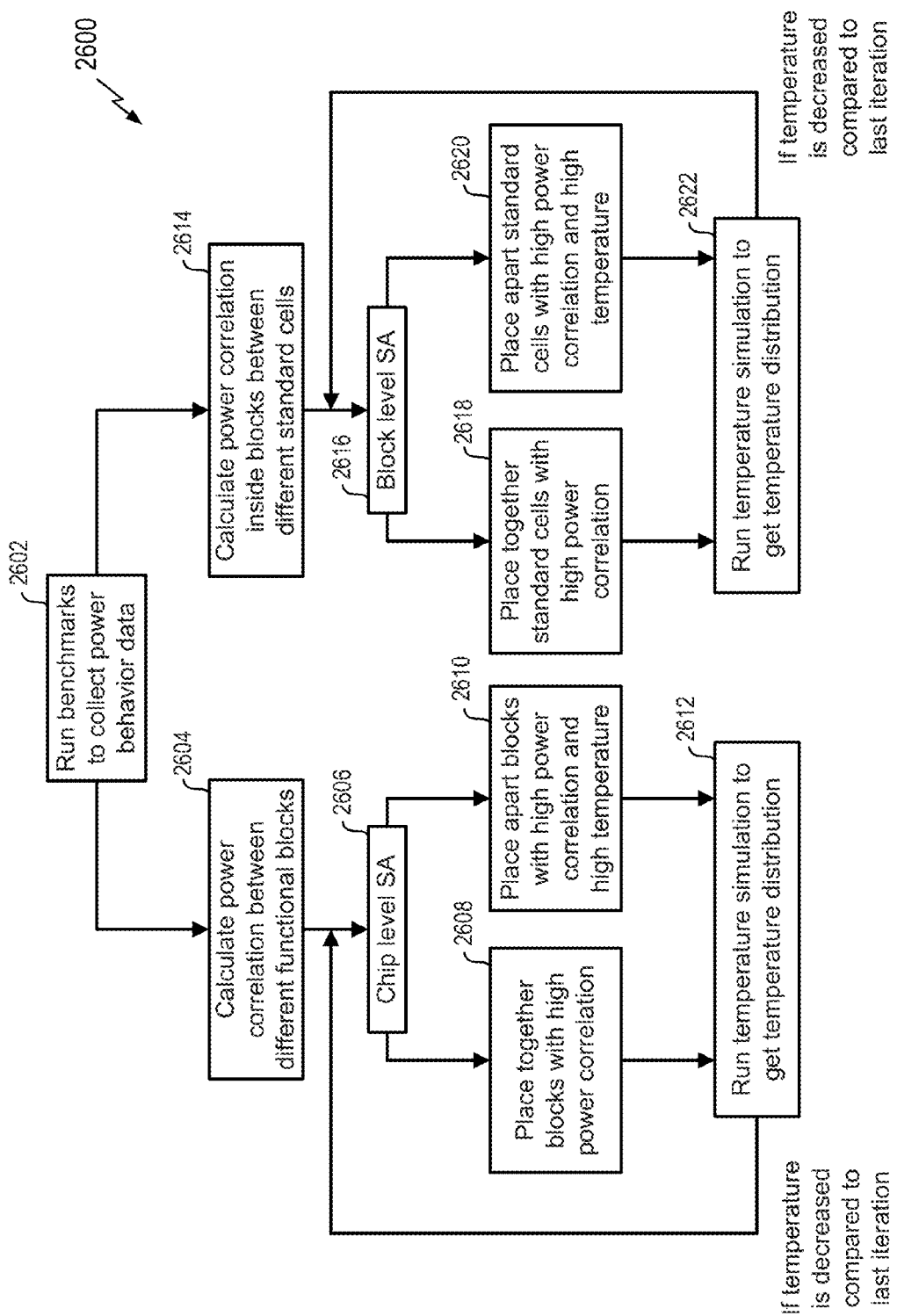
FIG. 26 is a diagram illustrating a process corresponding to a thermal-aware floorplan for a 3D-IC hybrid reconfigurable structure.

FIG. 26 is a diagram illustrating a process 2600 corresponding to a thermal-aware floorplan for a 3D-IC hybrid reconfigurable structure. A die level and block level are removed out of the hierarchy to illustrate the process. In an aspect, SA can be run several times to achieve a lower temperature.

According to the process 2600, benchmarks may be run to collect power behavior data 2602. Thereafter, the process may calculate a power correlation between different functional blocks 2604 and a chip level SA may be run 2606. Accordingly, blocks with high power correlation may be placed together 2608. Blocks with high power correlation and high temperature may be placed apart 2610. A temperature simulation may then be run to obtain a temperature distribution 2612. If the temperature is decreased compared to a last iteration, then the chip level SA (2606) may be run again.

Additionally and/or alternatively, after running the benchmarks to collect power behavior data 2602, the process may calculate a power correlation inside blocks between different standard cells 2614 and a block level SA may be run 2616. Accordingly, standard cells with high power correlation may be placed together 2618. Standard cells with high power correlation and high temperature may be placed apart 2620. A temperature simulation may then be run to obtain a temperature distribution 2622. If the temperature is decreased compared to a last iteration, then the block level SA (2616) may be run again.

Figure 27:
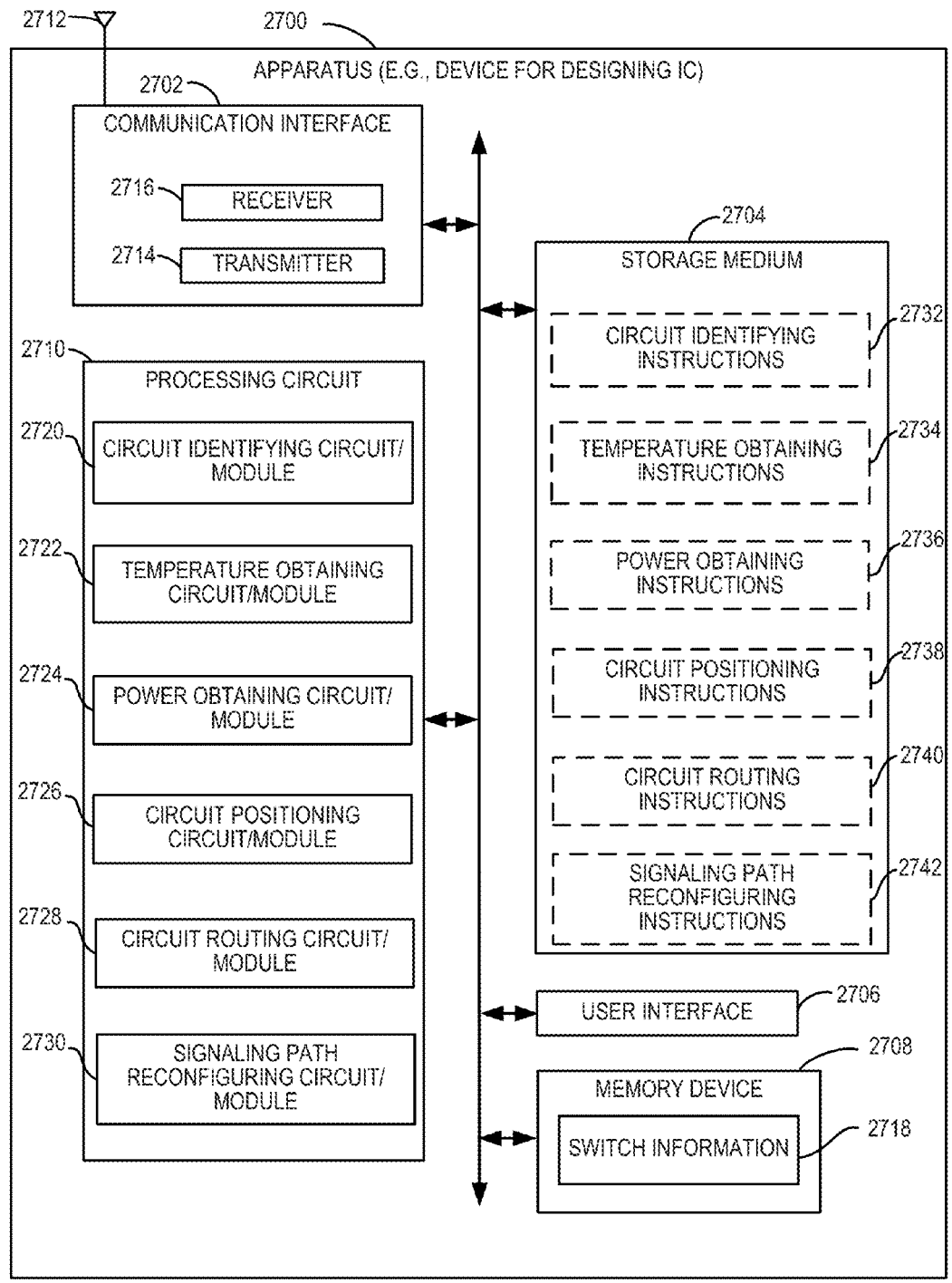
FIG. 27 is a block diagram of an example hardware implementation for an electronic device that supports designing an integrated circuit (IC) in accordance with some aspects of the disclosure.

FIG. 27 is an illustration of an apparatus 2700 configured to support operations related to designing an integrated circuit (IC) according to one or more aspects of the disclosure (e.g., aspects related to the method of FIG. 28 described below). The apparatus 2700 includes a communication interface (e.g., at least one transceiver) 2702, a storage medium 2704, a user interface 2706, a memory device 2708, and a processing circuit 2710.

These components can be coupled to and/or placed in electrical communication with one another via a signaling bus or other suitable component, represented generally by the connection lines in FIG. 27. The signaling bus may include any number of interconnecting buses and bridges depending on the specific application of the processing circuit 2710 and the overall design constraints. The signaling bus links together various circuits such that each of the communication interface 2702, the storage medium 2704, the user interface 2706, and the memory device 2708 are coupled to and/or in electrical communication with the processing circuit 2710. The signaling bus may also link various other circuits (not shown) such as timing sources, peripherals, voltage regulators, and power management circuits, which are well known in the art, and therefore, will not be described any further.

The communication interface 2702 may be adapted to facilitate communication of the apparatus 2700. For example, the communication interface 2702 may include circuitry and/or code (e.g., instructions) adapted to facilitate the communication of information bi-directionally with respect to one or more communication devices in a network. The communication interface 2702 may be coupled to one or more antennas 2712 for communication within a communication system. The communication interface 2702 can be configured with one or more standalone receivers and/or transmitters, as well as one or more transceivers. In the illustrated example, the communication interface 2702 includes a transmitter 2714 and a receiver 2716.

The memory device 2708 may represent one or more memory devices. As indicated, the memory device 2708 may maintain switch information 2718 along with other information used by the apparatus 2700. In some implementations, the memory device 2708 and the storage medium 2704 are implemented as a common memory component. The memory device 2708 may also be used for storing data that is manipulated by the processing circuit 2710 or some other component of the apparatus 2700.

The storage medium 2704 may represent one or more computer-readable, machine-readable, and/or processor-readable devices for storing code, such as processor executable code or instructions (e.g., software, firmware), electronic data, databases, or other digital information. The storage medium 2704 may also be used for storing data that is manipulated by the processing circuit 2710 when executing code. The storage medium 2704 may be any available media that can be accessed by a general purpose or special purpose processor, including portable or fixed storage devices, optical storage devices, and various other mediums capable of storing, containing or carrying code.

By way of example and not limitation, the storage medium 2704 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing code that may be accessed and read by a computer. The storage medium 2704 may be embodied in an article of manufacture (e.g., a computer program product). By way of example, a computer program product may include a computer-readable medium in packaging materials. In view of the above, in some implementations, the storage medium 2704 may be a non-transitory (e.g., tangible) storage medium.

The storage medium 2704 may be coupled to the processing circuit 2710 such that the processing circuit 2710 can read information from, and write information to, the storage medium 2704. That is, the storage medium 2704 can be coupled to the processing circuit 2710 so that the storage medium 2704 is at least accessible by the processing circuit 2710, including examples where at least one storage medium is integral to the processing circuit 2710 and/or examples where at least one storage medium is separate from the processing circuit 2710 (e.g., resident in the apparatus 2700, external to the apparatus 2700, distributed across multiple entities, etc.).

Code and/or instructions stored by the storage medium 2704, when executed by the processing circuit 2710, causes the processing circuit 2710 to perform one or more of the various functions and/or process operations described herein. For example, the storage medium 2704 may include operations configured for regulating operations at one or more hardware blocks of the processing circuit 2710, as well as to utilize the communication interface 2702 for communication utilizing their respective communication protocols.

The processing circuit 2710 is generally adapted for processing, including the execution of such code/instructions stored on the storage medium 2704. As used herein, the term "code" or "instructions" shall be construed broadly to include without limitation programming, instructions, instruction sets, data, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 2710 is arranged to obtain, process and/or send data, control data access and storage, issue commands, and control other desired operations. The processing circuit 2710 may include circuitry configured to implement desired code provided by appropriate media in at least one example. For example, the processing circuit 2710 may be implemented as one or more processors, one or more controllers, and/or other structure configured to execute executable code. Examples of the processing circuit 2710 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 2710 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 2710 are for illustration and other suitable configurations within the scope of the disclosure are also contemplated.

According to one or more aspects of the disclosure, the processing circuit 2710 may be adapted to perform any or all of the features, processes, functions, operations and/or routines for any or all of the apparatuses described herein. As used herein, the term "adapted" in relation to the processing circuit 2710 may refer to the processing circuit 2710 being one or more of configured, employed, implemented, and/or programmed to perform a particular process, function, operation and/or routine according to various features described herein.

According to at least one example of the apparatus 2700, the processing circuit 2710 may include one or more of a circuit identifying circuit/module 2720, a temperature obtaining circuit/module 2722, a power obtaining circuit/module 2724, a circuit positioning circuit/module 2726, a circuit routing circuit/module 2728, and a signaling path reconfiguring circuit/module 2730.

The circuit identifying circuit/module 2720 may include circuitry and/or instructions (e.g., circuit identifying instructions 2732 stored on the storage medium 2704) adapted to perform several functions relating to, for example, identifying a plurality of circuits to be positioned on an integrated circuit (IC).

The temperature obtaining circuit/module 2722 may include circuitry and/or instructions (e.g., temperature obtaining instructions 2734 stored on the storage medium 2704) adapted to perform several functions relating to, for example, obtaining a temperature characteristic associated with each of the circuits.

The power obtaining circuit/module 2724 may include circuitry and/or instructions (e.g., power obtaining instructions 2736 stored on the storage medium 2704) adapted to perform several functions relating to, for example, obtaining a power characteristic associated with each of the circuits.

The circuit positioning circuit/module 2726 may include circuitry and/or instructions (e.g., circuit positioning instructions 2738 stored on the storage medium 2704) adapted to perform several functions relating to, for example, positioning each circuit on the IC based on the temperature characteristics and the power characteristics of the circuits.

The circuit routing circuit/module 2728 may include circuitry and/or instructions (e.g., circuit routing instructions 2740 stored on the storage medium 2704) adapted to perform several functions relating to, for example, routing the circuits positioned on a first die to the circuits positioned on a second die via one or more switches.

The signaling path reconfiguring circuit/module 2730 may include circuitry and/or instructions (e.g., signaling path reconfiguring instructions 2742 stored on the storage medium 2704) adapted to perform several functions relating to, for example, reconfiguring a signaling path between at least one circuit positioned on the first die and at least one circuit positioned on the second die by dynamically switching the one or more switches based on a function of the IC.

As mentioned above, instructions stored by the storage medium 2704, when executed by the processing circuit 2710, causes the processing circuit 2710 to perform one or more of the various functions and/or process operations described herein. For example, the storage medium 2704 may include one or more of the circuit identifying instructions 2732, the temperature obtaining instructions 2734, the power obtaining instructions 2736, the circuit positioning instructions 2738, the circuit routing instructions 2740, and the signaling path reconfiguring instructions 2742.

Figure 28:
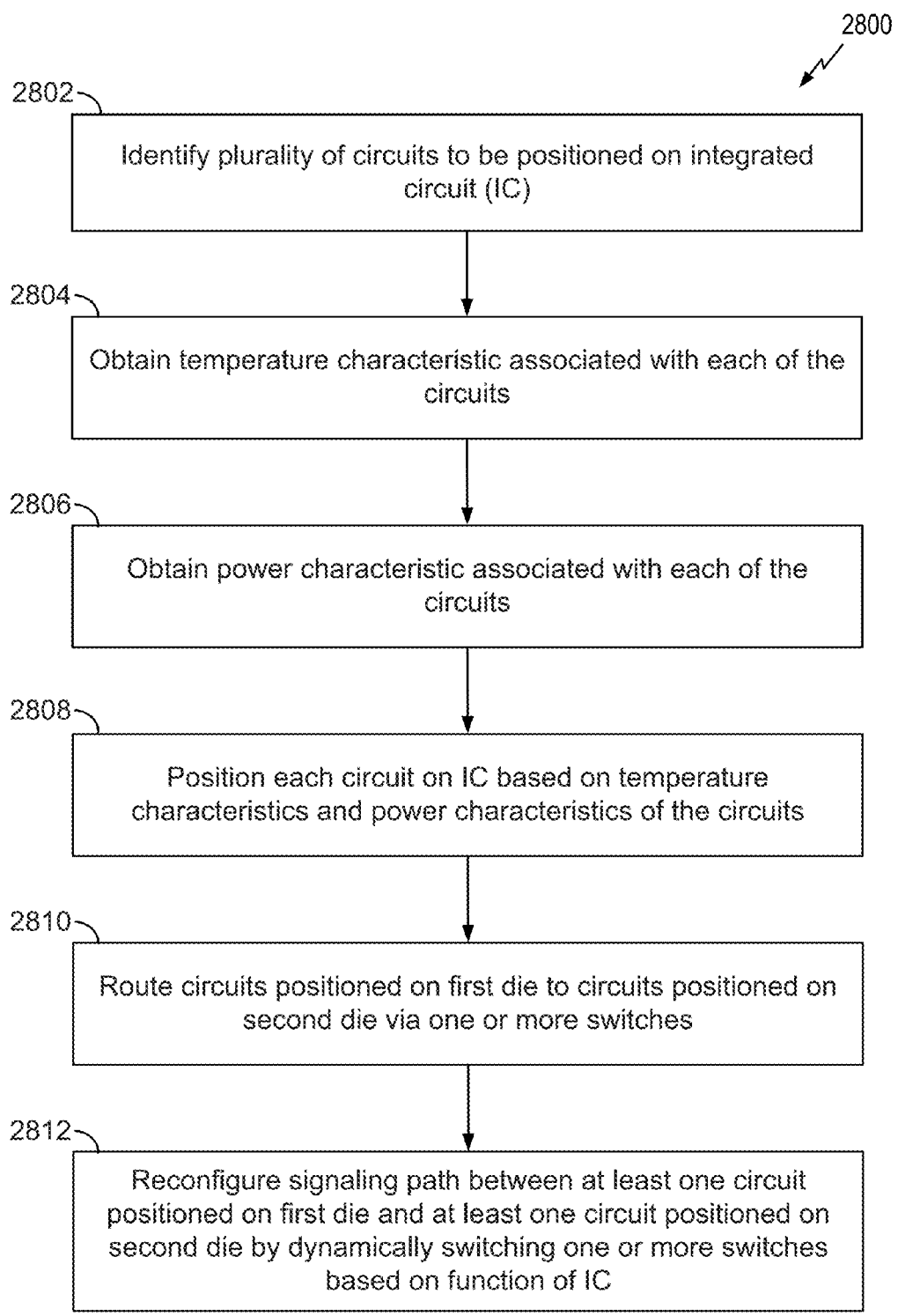
FIG. 28 illustrates a process for designing an integrated circuit (IC) in accordance with some aspects of the disclosure.

FIG. 28 illustrates a method/process 2800 of designing an integrated circuit (IC) in accordance with some aspects of the disclosure. The process 2800 may be performed by an apparatus, e.g., one or more of the 3D-IC of any of FIG. 1, 5, 6, 9-17, or 22), the apparatus 2700 of FIG. 27, or at least partially within a processing circuit (e.g., the processing circuit 2710 of FIG. 27), which may be located in an electronic device, a transceiver, or some other suitable apparatus. Of course, in various aspects within the scope of the disclosure, the process 2800 may be implemented by any suitable apparatus capable of supporting switching operations.

The apparatus identifies a plurality of circuits to be positioned on the IC 2802. The apparatus obtains a temperature characteristic associated with each of the circuits 2804. The apparatus obtains a power characteristic associated with each of the circuits 2806.

Moreover, the apparatus positions each circuit on the IC based on the temperature characteristics and the power characteristics of the circuits 2808. For example, the apparatus positions each circuit by positioning the circuits having a similar power characteristic (e.g., high power correlation) adjacent to each other. Moreover, the apparatus positions each circuit by positioning the circuits having a high temperature characteristic separate from each other, and positioning each circuit having the high temperature characteristic adjacent to a circuit having a low temperature characteristic.

In an aspect, the circuits are positioned among at least a first die and a second die, the first die lying within a first geometric plane and the second die lying with a second geometric plane different from the first geometric plane. Accordingly, the apparatus routes the circuits positioned on the first die to the circuits positioned on the second die via one or more switches 2810. The apparatus may also reconfigure a signaling path between at least one circuit positioned on the first die and at least one circuit positioned on the second die by dynamically switching the one or more switches based on a function of the IC 2812. The circuits having the similar power characteristic may share a single switch.

In a further aspect, at least one of the first die or the second die includes a plurality of layers including an upper layer, a bottom layer, and at least one middle layer. As such, the upper layer is electrically connected to the bottom layer by at least one first through-silicon via (TSV). Moreover, the at least one middle layer is electrically connected to the upper layer or the bottom layer by at least one second TSV, wherein the at least one second TSV is smaller than the at least one first TSV.

Figure 29:
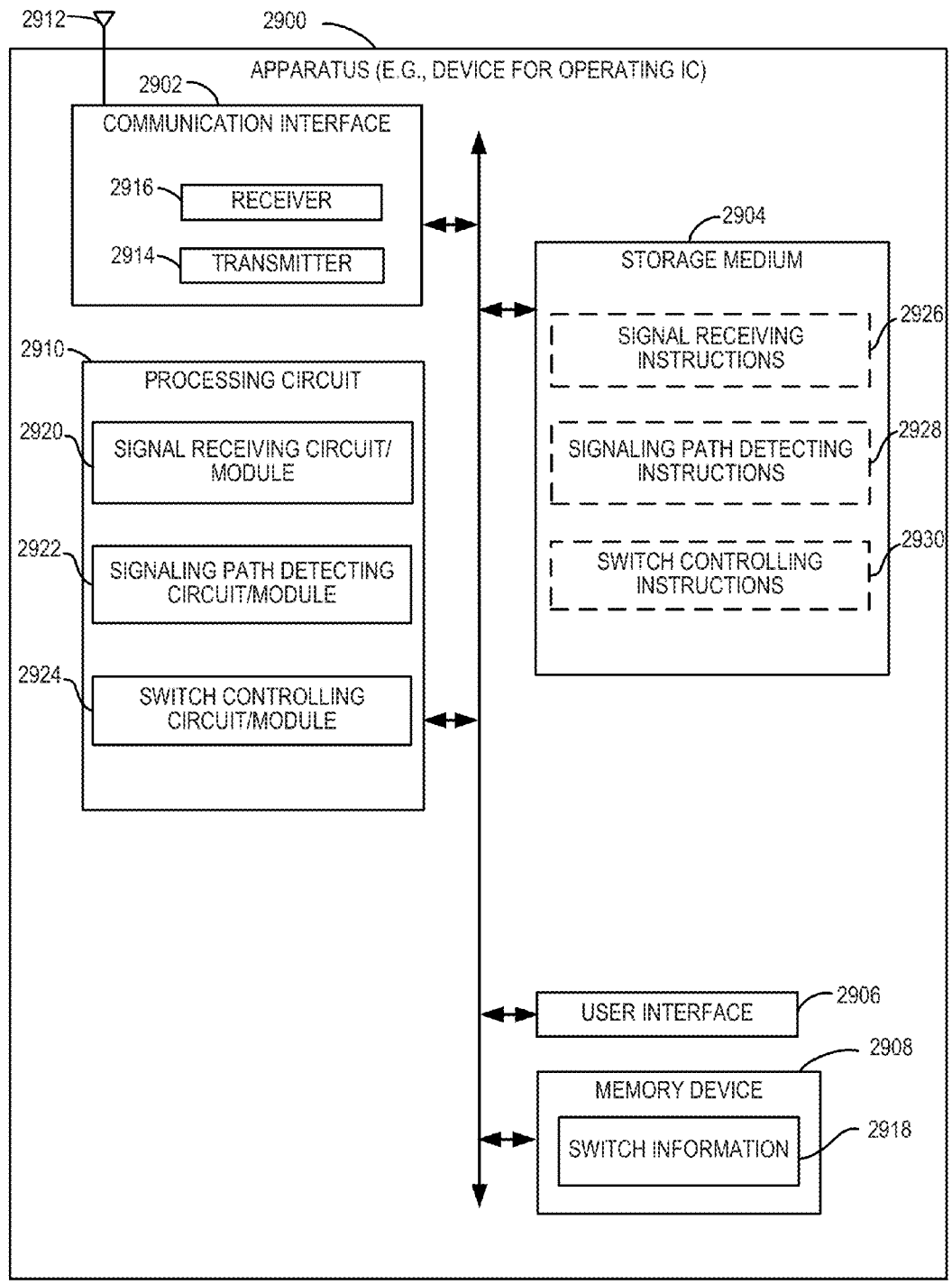
FIG. 29 is a block diagram of an example hardware implementation for an electronic device that supports operating an integrated circuit (IC) in accordance with some aspects of the disclosure.

FIG. 29 is an illustration of an apparatus 2900 configured to support operations related to operating an integrated circuit (IC) according to one or more aspects of the disclosure (e.g., aspects related to the methods of FIGS. 30 and 31 described below). The apparatus 2900 includes a communication interface (e.g., at least one transceiver) 2902, a storage medium 2904, a user interface 2906, a memory device 2908, and a processing circuit 2910.

These components can be coupled to and/or placed in electrical communication with one another via a signaling bus or other suitable component, represented generally by the connection lines in FIG. 29. The signaling bus may include any number of interconnecting buses and bridges depending on the specific application of the processing circuit 2910 and the overall design constraints. The signaling bus links together various circuits such that each of the communication interface 2902, the storage medium 2904, the user interface 2906, and the memory device 2908 are coupled to and/or in electrical communication with the processing circuit 2910. The signaling bus may also link various other circuits (not shown) such as timing sources, peripherals, voltage regulators, and power management circuits, which are well known in the art, and therefore, will not be described any further.

The communication interface 2902 may be adapted to facilitate communication of the apparatus 2900. For example, the communication interface 2902 may include circuitry and/or code (e.g., instructions) adapted to facilitate the communication of information bi-directionally with respect to one or more communication devices in a network. The communication interface 2902 may be coupled to one or more antennas 2912 for communication within a communication system. The communication interface 2902 can be configured with one or more standalone receivers and/or transmitters, as well as one or more transceivers. In the illustrated example, the communication interface 2902 includes a transmitter 2914 and a receiver 2916.

The memory device 2908 may represent one or more memory devices. As indicated, the memory device 2908 may maintain switch information 2918 along with other information used by the apparatus 2900. In some implementations, the memory device 2908 and the storage medium 2904 are implemented as a common memory component. The memory device 2908 may also be used for storing data that is manipulated by the processing circuit 2910 or some other component of the apparatus 2900.

The storage medium 2904 may represent one or more computer-readable, machine-readable, and/or processor-readable devices for storing code, such as processor executable code or instructions (e.g., software, firmware), electronic data, databases, or other digital information. The storage medium 2904 may also be used for storing data that is manipulated by the processing circuit 2910 when executing code. The storage medium 2904 may be any available media that can be accessed by a general purpose or special purpose processor, including portable or fixed storage devices, optical storage devices, and various other mediums capable of storing, containing or carrying code.

By way of example and not limitation, the storage medium 2904 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing code that may be accessed and read by a computer. The storage medium 2904 may be embodied in an article of manufacture (e.g., a computer program product). By way of example, a computer program product may include a computer-readable medium in packaging materials. In view of the above, in some implementations, the storage medium 2904 may be a non-transitory (e.g., tangible) storage medium.

The storage medium 2904 may be coupled to the processing circuit 2910 such that the processing circuit 2910 can read information from, and write information to, the storage medium 2904. That is, the storage medium 2904 can be coupled to the processing circuit 2910 so that the storage medium 2904 is at least accessible by the processing circuit 2910, including examples where at least one storage medium is integral to the processing circuit 2910 and/or examples where at least one storage medium is separate from the processing circuit 2910 (e.g., resident in the apparatus 2900, external to the apparatus 2900, distributed across multiple entities, etc.).

Code and/or instructions stored by the storage medium 2904, when executed by the processing circuit 2910, causes the processing circuit 2910 to perform one or more of the various functions and/or process operations described herein. For example, the storage medium 2904 may include operations configured for regulating operations at one or more hardware blocks of the processing circuit 2910, as well as to utilize the communication interface 2902 for communication utilizing their respective communication protocols.

The processing circuit 2910 is generally adapted for processing, including the execution of such code/instructions stored on the storage medium 2904. As used herein, the term "code" or "instructions" shall be construed broadly to include without limitation programming, instructions, instruction sets, data, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 2910 is arranged to obtain, process and/or send data, control data access and storage, issue commands, and control other desired operations. The processing circuit 2910 may include circuitry configured to implement desired code provided by appropriate media in at least one example. For example, the processing circuit 2910 may be implemented as one or more processors, one or more controllers, and/or other structure configured to execute executable code. Examples of the processing circuit 2910 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 2910 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 2910 are for illustration and other suitable configurations within the scope of the disclosure are also contemplated.

According to one or more aspects of the disclosure, the processing circuit 2910 may be adapted to perform any or all of the features, processes, functions, operations and/or routines for any or all of the apparatuses described herein. As used herein, the term "adapted" in relation to the processing circuit 2910 may refer to the processing circuit 2910 being one or more of configured, employed, implemented, and/or programmed to perform a particular process, function, operation and/or routine according to various features described herein.

According to at least one example of the apparatus 2900, the processing circuit 2910 may include one or more of a signal receiving circuit/module 2920, a signaling path detecting circuit/module 2922, and a switch controlling circuit/module 2924.

The signal receiving circuit/module 2920 may include circuitry and/or instructions (e.g., signal receiving instructions 2926 stored on the storage medium 2904) adapted to perform several functions relating to, for example, receiving a signal from at least one circuit positioned on a first die lying within a first geometric plane.

The signaling path detecting circuit/module 2922 may include circuitry and/or instructions (e.g., signaling path detecting instructions 2928 stored on the storage medium 2904) adapted to perform several functions relating to, for example, detecting a signaling path between the at least one circuit positioned on the first die and at least one circuit positioned on a second die lying within a second geometric plane that is different from the first geometric plane, wherein circuits having a similar power characteristic are positioned adjacent to each other on the first die and the second die and circuits having a high temperature characteristic are positioned separate from each other on the first die and the second die.

The switch controlling circuit/module 2924 may include circuitry and/or instructions (e.g., switch controlling instructions 2930 stored on the storage medium 2904) adapted to perform several functions relating to, for example, controlling one or more switches to route the signal along the signaling path. In an aspect of the disclosure, the switch controlling circuit/module 2924 may control the one or more switches to route the signal along the signaling path between a first die lying within a first geometric plane and a second die lying within a second geometric plane different from the first geometric plane, wherein the signal may be coupled to a plurality of circuits on the first die, wherein the plurality of circuits may include circuits having a similar power characteristic positioned adjacent to each other, wherein the signal may be further coupled to a second plurality of circuits on the first die or the second die, and wherein the second plurality of circuits may include circuits having a high temperature characteristic positioned separate from each other.

As mentioned above, instructions stored by the storage medium 2904, when executed by the processing circuit 2910, causes the processing circuit 2910 to perform one or more of the various functions and/or process operations described herein. For example, the storage medium 2904 may include one or more of the signal receiving instructions 2926, the signaling path detecting instructions 2928, and the switch controlling instructions 2930.

Figure 30:
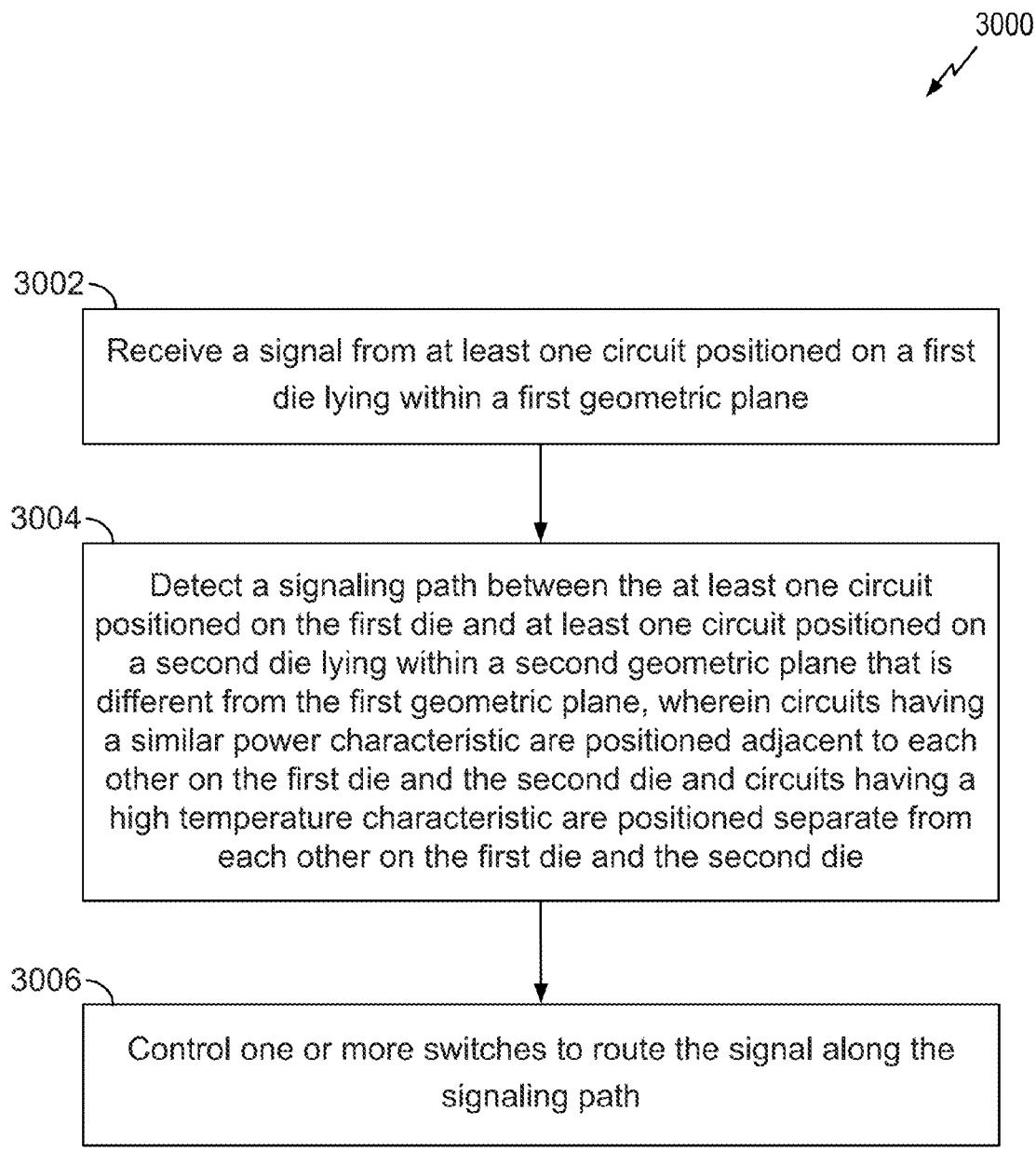
FIG. 30 illustrates a process for operating an integrated circuit (IC) in accordance with some aspects of the disclosure.

FIG. 30 illustrates a method/process 3000 of operating an integrated circuit (IC) in accordance with some aspects of the disclosure. The process 3000 may be performed by an apparatus, e.g., one or more of the 3D-IC of any of FIG. 1, 5, 6, 9-17, or 22), the apparatus 2900 of FIG. 29, or at least partially within a processing circuit (e.g., the processing circuit 2910 of FIG. 29), which may be located in an electronic device, a transceiver, or some other suitable apparatus. Of course, in various aspects within the scope of the disclosure, the process 3000 may be implemented by any suitable apparatus capable of supporting switching operations.

The apparatus may receive a signal from at least one circuit positioned on a first die lying within a first geometric plane 3002.

The apparatus may further detect a signaling path between the at least one circuit positioned on the first die and at least one circuit positioned on a second die lying within a second geometric plane that is different from the first geometric plane 3004. Circuits having a similar power characteristic may be positioned adjacent to each other on the first die and the second die and circuits having a high temperature characteristic may be positioned separate from each other on the first die and the second die. Moreover, each circuit having the high temperature characteristic may be positioned adjacent to a circuit having a low temperature characteristic.

The apparatus may then control one or more switches to route the signal along the signaling path 3006. The at least one circuit positioned on the first die may be electrically coupled to the at least one circuit positioned on the second die via the one or more switches. Also, the circuits having the similar power characteristic may share a single switch. The apparatus may control the one or more switches by dynamically switching the one or more switches to reconfigure the signaling path between the at least one circuit positioned on the first die and the at least one circuit positioned on the second die.

In an aspect, at least one of the first die or the second die includes a plurality of layers including an upper layer, a bottom layer, and at least one middle layer. As such, the upper layer is electrically connected to the bottom layer by at least one first through-silicon via (TSV). Moreover, the at least one middle layer may be electrically connected to the upper layer or the bottom layer by at least one second TSV, wherein the at least one second TSV is smaller than the at least one first TSV.

Figure 31:
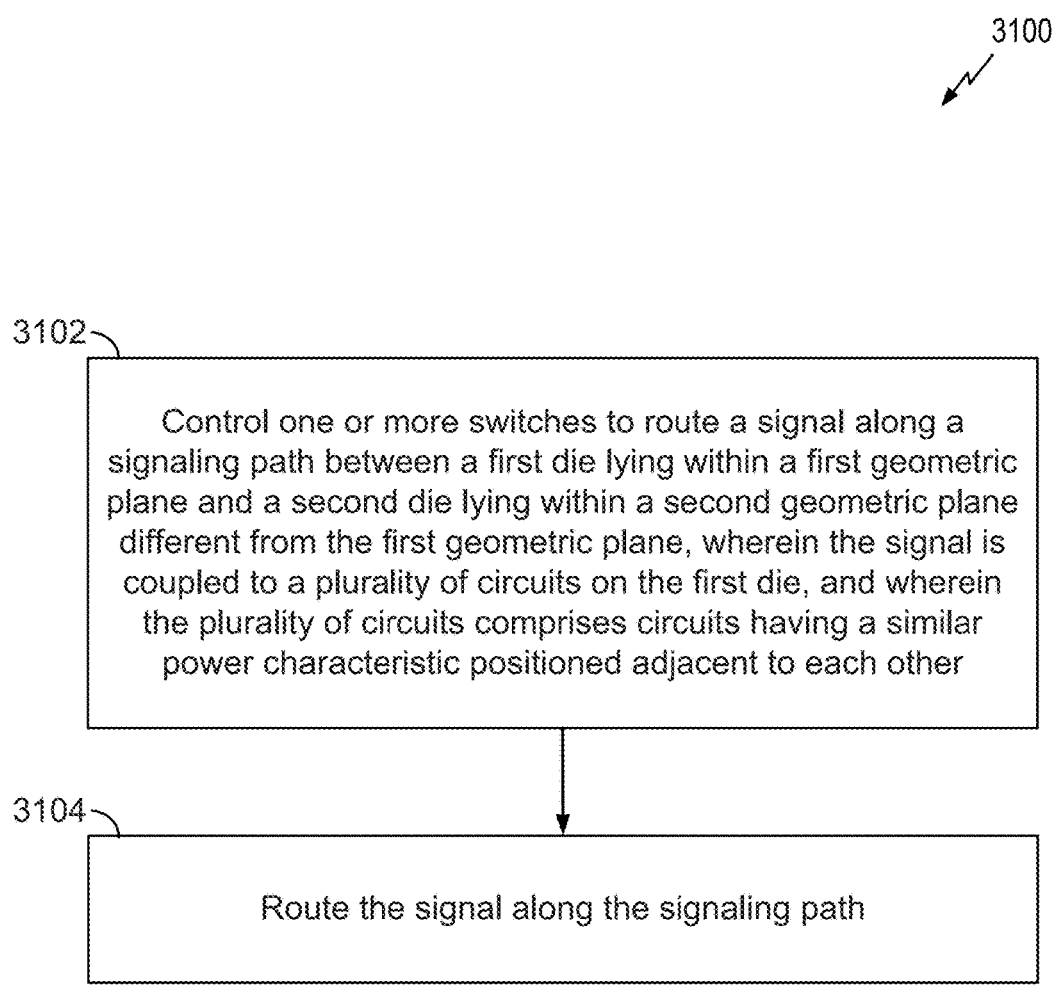
FIG. 31 illustrates another process for operating an integrated circuit (IC) in accordance with some aspects of the disclosure.

FIG. 31 illustrates a method/process 3100 of operating an integrated circuit (IC) in accordance with some aspects of the disclosure. The process 3100 may be performed by an apparatus, e.g., one or more of the 3D-IC of any of FIG. 1, 5, 6, 9-17, or 22), the apparatus 2900 of FIG. 29, or at least partially within a processing circuit (e.g., the processing circuit 2910 of FIG. 29), which may be located in an electronic device, a transceiver, or some other suitable apparatus. Of course, in various aspects within the scope of the disclosure, the process 3100 may be implemented by any suitable apparatus capable of supporting switching operations.

The apparatus may control one or more switches (e.g., switch circuits 106, 112 of FIG. 1B or switch structure 2300 of FIG. 23A) to route a signal along a signaling path between a first die (e.g., first die 102 of FIG. 1B or any one of dies 2208, 2210, 2212, 2214, 2216, and 2218 of FIG. 22) lying within a first geometric plane and a second die (e.g., second die 104 of FIG. 1B or any one of dies 2228, 2230, 2232, and 2234 of FIG. 22) lying within a second geometric plane different from the first geometric plane 3102. The signal may be coupled to a plurality of circuits (e.g., circuits 108 of FIG. 1B) on the first die. Moreover, the plurality of circuits may include circuits having a similar power characteristic positioned adjacent to each other. The circuits having the similar power characteristic may be powered by a single one of the one or more switches. Controlling the one or more switches may include dynamically switching the one or more switches to reconfigure the signaling path between the first die and the second die.

The apparatus may route the signal (e.g., via TSVs 2302 of FIG. 23A) along the signaling path 3104.

In an aspect, the signal may be further coupled to a second plurality of circuits (e.g., circuits 114 of FIG. 1B) on the first die or the second die. The second plurality of circuits may include circuits having a high temperature characteristic positioned separate from each other. The second plurality of circuits may be the same as, or different from, the plurality of circuits. Moreover, the second plurality of circuits may be on the first die and the second die.

In an aspect, the circuits having the high temperature characteristic are positioned adjacent to a circuit having a low temperature characteristic. The circuit having the low temperature characteristic may not be part of the second plurality of circuits. Each of the circuits having the high temperature characteristic may be powered by different ones of the one or more switches.

In an aspect, at least one of the first die or the second die may include a plurality of layers including an upper layer (e.g., upper device layer 2112 of FIG. 21), a bottom layer (e.g., lower device layer 2106 of FIG. 21), and at least one middle layer (e.g., middle device layer 2110 of FIG. 21). The upper layer may be electrically connected to the bottom layer by at least one first through-silicon via (TSV) (e.g., TSV 2114 of FIG. 21). The at least one middle layer may be electrically connected to the upper layer or the bottom layer by at least one second TSV (e.g., mini-TSV 2102 of FIG. 21), wherein the at least one second TSV is smaller than the at least one first TSV.

According some aspects of the disclosure, an apparatus comprising an integrated circuit (IC) may include means for controlling one or more switches (e.g., the processing circuit 2710 controlling the switch circuits 106, 112 of FIG. 1B or switch structure 2300 of FIG. 23A) to route a signal along a signaling path between a first die lying within a first geometric plane and a second die lying within a second geometric plane different from the first geometric plane. The signal may be coupled to a plurality of circuits on the first die. Moreover, the plurality of circuits may include circuits having a similar power characteristic positioned adjacent to each other. The circuits having the similar power characteristic may be powered by a single one of the one or more switches. The means for controlling the one or more switches dynamically switches the one or more switches to reconfigure the signaling path between the first die and the second die.

The apparatus may further include means for routing the signal along the signaling path (e.g., TSVs 2302 of FIG. 23A).

In an aspect, the signal may be further coupled to a second plurality of circuits on the first die or the second die. The second plurality of circuits may include circuits having a high temperature characteristic positioned separate from each other. The second plurality of circuits may be the same as, or different from, the plurality of circuits. Moreover, the second plurality of circuits may be on the first die and the second die.

In an aspect, the circuits having the high temperature characteristic are positioned adjacent to a circuit having a low temperature characteristic. The circuit having the low temperature characteristic may not be part of the second plurality of circuits. Each of the circuits having the high temperature characteristic may be powered by different ones of the one or more switches.

In an aspect, at least one of the first die or the second die may include a plurality of layers including an upper layer, a bottom layer, and at least one middle layer. The upper layer may be electrically connected to the bottom layer by at least one first through-silicon via (TSV). The at least one middle layer may be electrically connected to the upper layer or the bottom layer by at least one second TSV, wherein the at least one second TSV is smaller than the at least one first TSV.

According some aspects of the disclosure, an apparatus comprising an integrated circuit (IC) may include a first die (e.g., first die 102 of FIG. 1B or any one of dies 2208, 2210, 2212, 2214, 2216, and 2218 of FIG. 22) lying within a first geometric plane, a second die (e.g., second die 104 of FIG. 1B or any one of dies 2228, 2230, 2232, and 2234 of FIG. 22) lying within a second geometric plane that is different from the first geometric plane, a plurality of circuits (e.g., circuits 108 of FIG. 1B) on the first die, wherein the plurality of circuits comprises circuits having a similar power characteristic positioned adjacent to each other, and one or more switches (e.g., switch circuits 106, 112 of FIG. 1B or switch structure 2300 of FIG. 23A) configured to route a signal coupled to the plurality of circuits along a signaling path between the first die and the second die. The circuits having the similar power characteristic may be powered by a single one of the one or more switches. The one or more switches may be configured to dynamically switch to reconfigure the signaling path between the first die and the second die.

The apparatus may further include a second plurality of circuits on the first die or the second die (e.g., circuits 114 of FIG. 1B). The signal may be further coupled to the second plurality of circuits, wherein the second plurality of circuits may include circuits having a high temperature characteristic positioned separate from each other. The second plurality of circuits may be the same as, or different from, the plurality of circuits. Moreover, the second plurality of circuits may be on the first die and the second die.

In an aspect, the circuits having the high temperature characteristic are positioned adjacent to a circuit having a low temperature characteristic. The circuit having the low temperature characteristic may not be part of the second plurality of circuits. Each of the circuits having the high temperature characteristic may be powered by different ones of the one or more switches.

In an aspect, at least one of the first die or the second die may include a plurality of layers including an upper layer (e.g., upper device layer 2112 of FIG. 21), a bottom layer (e.g., lower device layer 2106 of FIG. 21), and at least one middle layer (e.g., middle device layer 2110 of FIG. 21). The upper layer may be electrically connected to the bottom layer by at least one first through-silicon via (TSV) (e.g., TSV 2114 of FIG. 21). The at least one middle layer may be electrically connected to the upper layer or the bottom layer by at least one second TSV (e.g., mini-TSV 2102 of FIG. 21), wherein the at least one second TSV is smaller than the at least one first TSV.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the disclosure.

While features of the disclosure may have been discussed relative to certain implementations and figures, all implementations of the disclosure can include one or more of the advantageous features discussed herein. In other words, while one or more implementations may have been discussed as having certain advantageous features, one or more of such features may also be used in accordance with any of the various implementations discussed herein. In similar fashion, while exemplary implementations may have been discussed herein as device, system, or method implementations, it should be understood that such exemplary implementations can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

Within the disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the disclosure, without limitation as to the type of electronic circuits, as well as software implementations of information and instructions that, when executed by a processor, enable the performance of the functions described in the disclosure.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims No claim element is to be construed under the provisions of 35 U.S.C. § 112(f), unless the element is expressly recited using the phrase "means for" or, in the case of a method claim, the element is recited using the phrase "step for."

Accordingly, the various features associated with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. A method of operating an integrated circuit (IC), comprising:
    controlling one or more switches to route a signal along a signaling path between a first die lying within a first geometric plane and a second die lying within a second geometric plane different from the first geometric plane,
    wherein the signal is coupled to a plurality of circuits on the first die,
    wherein the plurality of circuits comprises circuits that consume a similar amount of power positioned adjacent to each other, and
    wherein the signal is further coupled to a second plurality of circuits on the first die or the second die, wherein the second plurality of circuits comprises circuits having a high temperature characteristic positioned separate from each other; and
    routing the signal through the one or more switches along the signaling path.

2. The method of claim 1, wherein the second plurality of circuits is on the first die and the second die.

3. The method of claim 1, wherein the circuits having the high temperature characteristic are positioned adjacent to a circuit having a low temperature characteristic.

4. The method of claim 1, wherein each of the circuits having the high temperature characteristic is powered by different ones of the one or more switches.

5. The method of claim 1, wherein controlling the one or more switches includes dynamically switching the one or more switches to reconfigure the signaling path between the first die and the second die.

6. The method of claim 1, wherein the circuits that consume the similar amount of power are powered by a single one of the one or more switches.

7. The method of claim 1, wherein:
    at least one of the first die or the second die includes a plurality of layers including an upper layer, a bottom layer, and at least one middle layer,
    the upper layer is electrically connected to the bottom layer by at least one first through-silicon via (TSV), and
    the at least one middle layer is electrically connected to the upper layer or the bottom layer by at least one second TSV, wherein the at least one second TSV is smaller than the at least one first TSV.

8. An apparatus comprising an integrated circuit (IC), comprising:
    a first die lying within a first geometric plane;
    a second die lying within a second geometric plane that is different from the first geometric plane;
    a plurality of circuits on the first die, wherein the plurality of circuits comprises circuits that consume a similar amount of power positioned adjacent to each other;
    one or more switches configured to route a signal coupled to the plurality of circuits through the one or more switches along a signaling path between the first die and the second die; and
    a second plurality of circuits on the first die or the second die, wherein the signal is further coupled to the second plurality of circuits, and wherein the second plurality of circuits comprises circuits having a high temperature characteristic positioned separate from each other.

9. The apparatus of claim 8, wherein the second plurality of circuits is on the first die and the second die.

10. The apparatus of claim 8, wherein the circuits having the high temperature characteristic are positioned adjacent to a circuit having a low temperature characteristic.

11. The apparatus of claim 8, wherein each of the circuits having the high temperature characteristic is powered by different ones of the one or more switches.

12. The apparatus of claim 8, wherein the one or more switches are configured to dynamically switch to reconfigure the signaling path between the first die and the second die.

13. The apparatus of claim 8, wherein the circuits that consume the similar amount of power are powered by a single one of the one or more switches.

14. The apparatus of claim 8, wherein:
    at least one of the first die or the second die includes a plurality of layers including an upper layer, a bottom layer, and at least one middle layer,
    the upper layer is electrically connected to the bottom layer by at least one first through-silicon via (TSV), and
    the at least one middle layer is electrically connected to the upper layer or the bottom layer by at least one second TSV, wherein the at least one second TSV is smaller than the at least one first TSV.

15. An apparatus comprising an integrated circuit (IC), comprising:
    means for controlling one or more switches to route a signal along a signaling path between a first die lying within a first geometric plane and a second die lying within a second geometric plane different from the first geometric plane, wherein the signal is coupled to a plurality of circuits on the first die, wherein the plurality of circuits comprises circuits that consume a similar amount of power positioned adjacent to each other, and wherein the signal is further coupled to a second plurality of circuits on the first die or the second die, wherein the second plurality of circuits comprises circuits having a high temperature characteristic positioned separate from each other; and means for routing the signal through the one or more switches along the signaling path.

16. The apparatus of claim 15, wherein the second plurality of circuits is on the first die and the second die.

17. The apparatus of claim 15, wherein the circuits having the high temperature characteristic are positioned adjacent to a circuit having a low temperature characteristic.

18. The apparatus of claim 15, wherein each of the circuits having the high temperature characteristic is powered by different ones of the one or more switches.

19. The apparatus of claim 15, wherein the means for controlling the one or more switches dynamically switches the one or more switches to reconfigure the signaling path between the first die and the second die.

20. The apparatus of claim 15, wherein the circuits that consume the similar amount of power are powered by a single one of the one or more switches.

21. The apparatus of claim 15, wherein:
at least one of the first die or the second die includes a plurality of layers including an upper layer, a bottom layer, and at least one middle layer,
the upper layer is electrically connected to the bottom layer by at least one first through-silicon via (TSV), and
the at least one middle layer is electrically connected to the upper layer or the bottom layer by at least one second TSV, wherein the at least one second TSV is smaller than the at least one first TSV.

22. An apparatus for operating an integrated circuit (IC), comprising:
one or more switches; and
a processing circuit coupled to the one or more switches and configured to:
receive a signal from at least one circuit positioned on a first die lying within a first geometric plane,
detect a signaling path between the at least one circuit positioned on the first die and at least one circuit positioned on a second die lying within a second geometric plane that is different from the first geometric plane, wherein a first plurality of circuits that consume a similar amount of power are positioned adjacent to each other on the first die and the second die and a second plurality of circuits having a high temperature characteristic are positioned separate from each other on the first die and the second die, and
control the one or more switches to route the signal through the one or more switches along the signaling path.

23. The apparatus of claim 22, wherein each circuit having the high temperature characteristic is positioned adjacent to a circuit having a low temperature characteristic.

24. The apparatus of claim 22, wherein the at least one circuit positioned on the first die is electrically coupled to the at least one circuit positioned on the second die via the one or more switches.

25. The apparatus of claim 22, wherein the processing circuit configured to control the one or more switches is configured to dynamically switch the one or more switches to reconfigure the signaling path between the at least one circuit positioned on the first die and the at least one circuit positioned on the second die.

26. The apparatus of claim 22, wherein the circuits that consume the similar amount of power are powered by a single one of the one or more switches.

27. The apparatus of claim 22, wherein:
at least one of the first die or the second die includes a plurality of layers including an upper layer, a bottom layer, and at least one middle layer,
the upper layer is electrically connected to the bottom layer by at least one first through-silicon via (TSV), and
the at least one middle layer is electrically connected to the upper layer or the bottom layer by at least one second TSV, wherein the at least one second TSV is smaller than the at least one first TSV.

* * * * *